United States Patent
Segovia Fernandez et al.

(10) Patent No.: US 11,264,970 B2
(45) Date of Patent: Mar. 1, 2022

(54) PIEZOELECTRIC RESONATOR WITH PATTERNED RESONANT CONFINERS

(71) Applicant: Texas Instruments Incorporated, Dallas, TX (US)

(72) Inventors: Jeronimo Segovia Fernandez, San Jose, CA (US); Peter Smeys, San Jose, CA (US); Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 16/290,873

(22) Filed: Mar. 2, 2019

(65) Prior Publication Data
US 2020/0280300 A1 Sep. 3, 2020

(51) Int. Cl.
*H03H 9/17* (2006.01)
*H03H 9/02* (2006.01)
*H03H 9/15* (2006.01)

(52) U.S. Cl.
CPC ........ *H03H 9/175* (2013.01); *H03H 9/02015* (2013.01); *H03H 9/02047* (2013.01); *H03H 9/02062* (2013.01); *H03H 9/02118* (2013.01); *H03H 9/15* (2013.01); *H03H 2009/155* (2013.01)

(58) Field of Classification Search
CPC .......... H03H 9/02015; H03H 9/02047; H03H 9/02062; H03H 9/02118; H03H 9/132; H03H 9/15; H03H 2009/155; H03H 9/173; H03H 9/175
USPC ................................................ 333/187, 189
See application file for complete search history.

(56) References Cited

U.S. PATENT DOCUMENTS

| | | | |
|---|---|---|---|
| 5,373,268 A | 12/1994 | Dworsky et al. | |
| 6,087,198 A | 7/2000 | Panasik | |
| 6,424,237 B1 * | 7/2002 | Ruby | H03H 9/0211 333/187 |
| 6,548,942 B1 | 4/2003 | Panasik | |
| 6,812,619 B1 * | 11/2004 | Kaitila | H03H 9/132 310/320 |
| 9,129,886 B2 | 9/2015 | Jacobsen et al. | |
| 9,503,047 B2 | 11/2016 | Jacobsen et al. | |
| 9,524,881 B2 | 12/2016 | Jiang et al. | |
| 9,660,603 B2 | 5/2017 | Jiang et al. | |
| 9,896,330 B2 | 2/2018 | Wachtler et al. | |
| 9,929,714 B2 | 3/2018 | Jacobsen et al. | |
| 10,135,415 B2 | 11/2018 | Soman et al. | |

(Continued)

OTHER PUBLICATIONS

N. Nguyen et al.; "Design of High-Q Thin Film Bulk Acoustic Resonator Using Dual-Mode Reflection"; 2014 IEEE International Ultrasonics Symposium Proceedings, 2014, pp. 487-490. (Year: 2014).*

(Continued)

*Primary Examiner* — Barbara Summons
(74) *Attorney, Agent, or Firm* — Michael A. Davis, Jr.; Charles A. Brill; Frank D. Cimino

(57) ABSTRACT

A MEMS resonator is operated at its parallel resonance frequency. An acoustic wave is propagated laterally away from a central region of the MEMS resonator through a piezoelectric layer of the MEMS resonator. The propagating acoustic wave is attenuated with concentric confiners that surround and are spaced apart from a perimeter of an electrode that forms the MEMS resonator.

24 Claims, 17 Drawing Sheets

(56) References Cited

U.S. PATENT DOCUMENTS

| | | | | |
|---|---|---|---|---|
| 2002/0030424 | A1* | 3/2002 | Iwata | H03H 9/132 |
| | | | | 310/363 |
| 2004/0195937 | A1* | 10/2004 | Matsubara | H03H 9/02102 |
| | | | | 310/320 |
| 2006/0170519 | A1* | 8/2006 | Thalhammer | H03H 9/175 |
| | | | | 333/187 |
| 2008/0051039 | A1* | 2/2008 | Iwasaki | H03H 9/564 |
| | | | | 455/73 |
| 2011/0249889 | A1 | 10/2011 | Kothandaraman et al. | |
| 2014/0111288 | A1* | 4/2014 | Nikkel | H03H 9/02118 |
| | | | | 333/187 |
| 2017/0026029 | A1 | 1/2017 | Bahai et al. | |
| 2017/0330841 | A1 | 11/2017 | Cook et al. | |
| 2018/0175826 | A1* | 6/2018 | Sadhu | H03H 9/564 |
| 2018/0246323 | A1 | 8/2018 | Fedigan et al. | |
| 2019/0007020 | A1 | 1/2019 | Yen | |
| 2019/0007023 | A1 | 1/2019 | Yen | |
| 2019/0052247 | A1 | 2/2019 | Yen | |
| 2019/0222193 | A1* | 7/2019 | Bader | H03H 9/175 |

OTHER PUBLICATIONS

Remco Strijbos et al, "Design and Characterisation of High-Q Solidly-Mounted Bulk Acoustic Wave Filters", 2007 Proceedings 57th Electronic Components and Technology Conference, May 29-Jun. 1, 2007, Reno, Nevada, pp. 169-174.

Ting-Ta Yen et al, "Bulk Acoustic Wave Resonator on a Stress Isolated Platform", TI-78499, U.S. Appl. No. 15/857,906, filed Dec. 29, 2017, pp. 1-22.

Arun Paidmarri et all, "A 0.68V 0.68mW 2.4GHz PLL for Ultra-low Power RF Systems", 2015 IEEE Radio Frequency Integrated Circuits Symposium (RFIC), May 17-19, 2015, Phoenix, AZ, pp. 1-4.

Ndrew Nelson et all, "A 22uW, 2.0GHz FBAR Oscillator", 2011 IEEE Radio Frequency Integrated Circuits Symposium (RFIC), Jun. 5-7, 2011, Baltimore, MD, pp. 1-4.

* cited by examiner

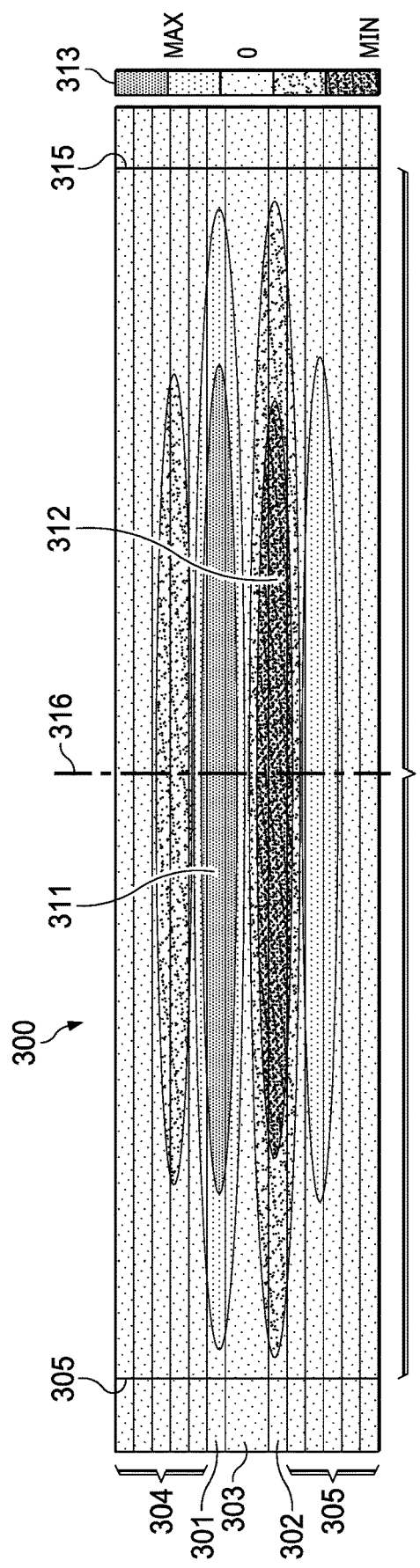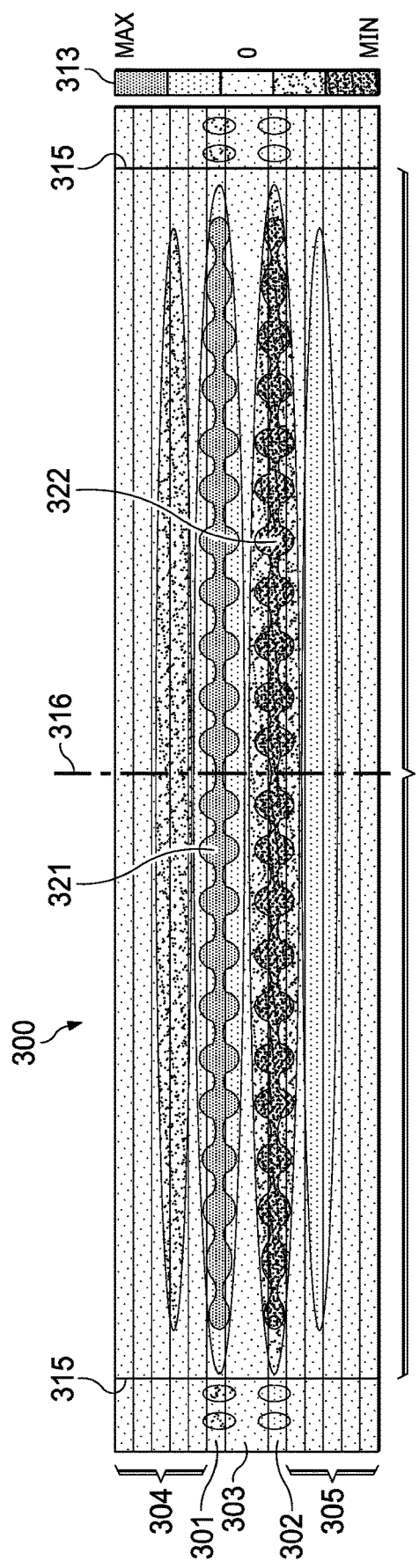

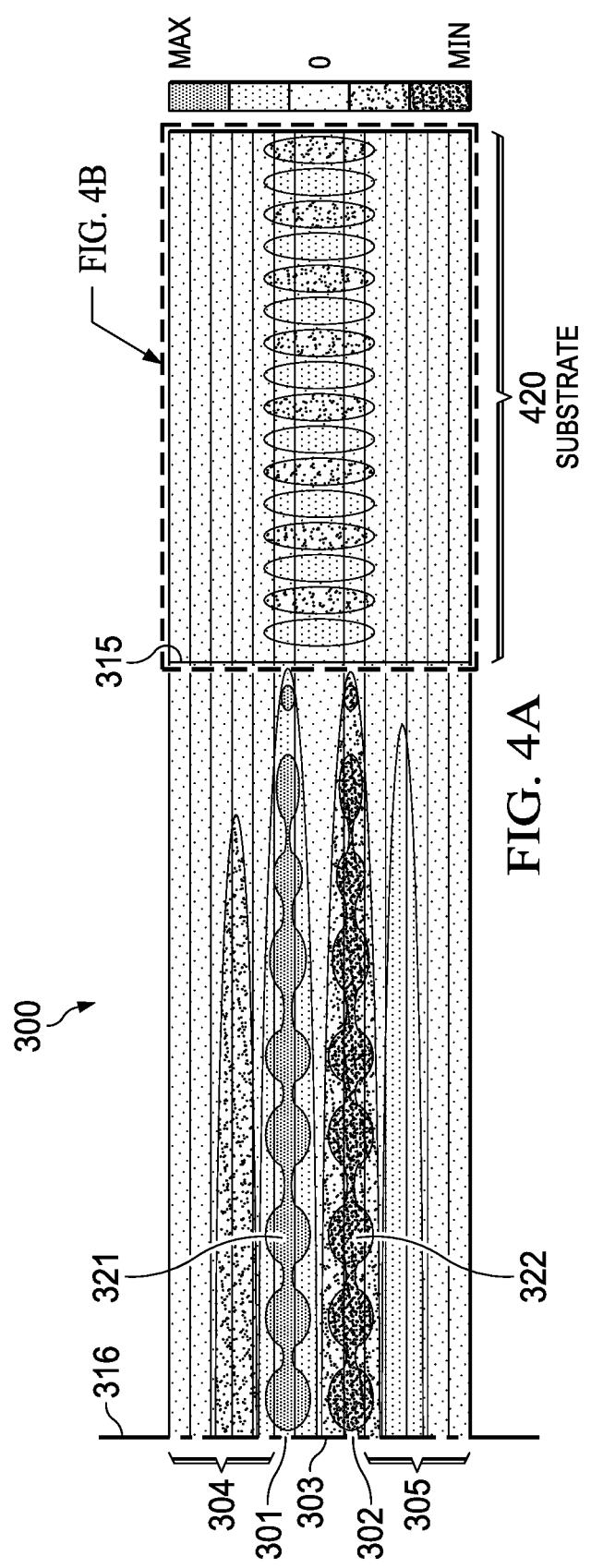

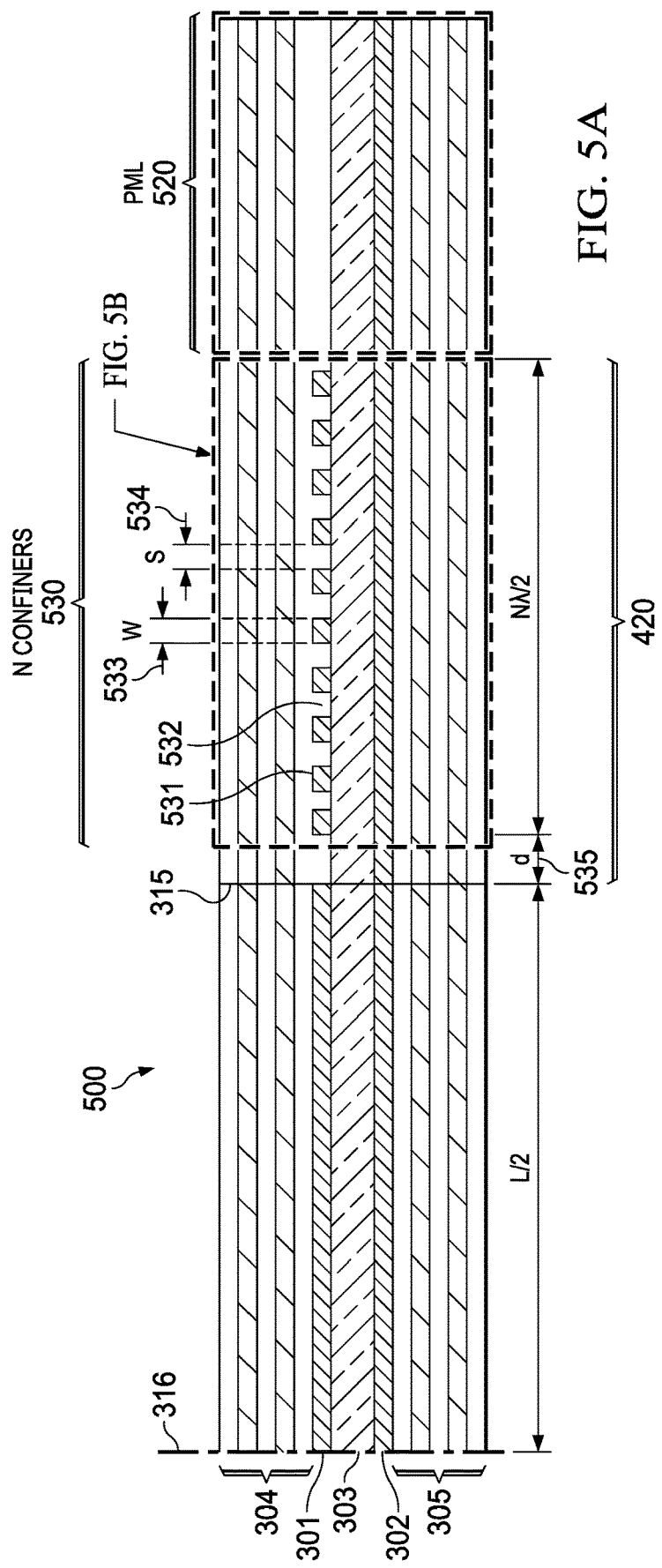

PIEZOELECTRIC RESONATOR WITH PATTERNED RESONANT CONFINERS

TECHNICAL FIELD

This disclosure relates to microelectromechanical system resonators.

BACKGROUND OF THE DISCLOSURE

Microelectromechanical system (MEMS) resonators are used for multiple applications, among them low-power, low-phase noise, high stability oscillators. Integrating the MEMS resonators with the integrated circuit chips in a regular semiconductor packaging is usually a challenging aspect of such devices. Multiple approaches have been used, such as: wire-bonding, flip-chip, CMOS-MEMS, etc.

A bulk acoustic wave (BAW) resonator is a MEMS device that includes a piezoelectric thin film sandwiched between two electrodes and acoustically isolated from the surrounding medium. BAW resonators using piezoelectric films with thicknesses ranging from several micrometers down to tenth of micrometers resonate in the frequency range of roughly 100 MHz to 10 GHz. Aluminum nitride and zinc oxide are two common piezoelectric materials used in MEMS acoustic wave resonators.

Several types of MEMS acoustic wave resonator-based oscillators are known, see for example: Paidimarri, Arun, Nathan Ickes, and Anantha P. Chandrakasan, "A 0.68V 0.68 mW 2.4 GHz PLL for Ultra-Low Power RF Systems." 2015 IEEE Radio Frequency Integrated Circuits Symposium (RFIC) (May 2015); A. Nelson, J. Hu, J. Kaitila, R. Ruby and B. Otis, "A 22 µW, 2.0 GHz FBAR oscillator," 2011 *IEEE Radio Frequency Integrated Circuits Symposium*, Baltimore, Md., 2011, pp. 1-4.

SUMMARY

An example micromechanical system (MEMS) resonator is formed on a base substrate. A piezoelectric member is attached to the base substrate. The piezoelectric member has a first electrode attached to a bottom surface of the piezoelectric member and a second electrode attached to a top surface of the piezoelectric member (opposite the first electrode). The first electrode is bounded by a perimeter edge. Concentric periodically spaced confiners are attached to the first surface of the piezoelectric member and are concentric with the first electrode and spaced from the perimeter edge of the first electrode by a distance. Each confiner has a width and is separated from an adjacent confiner by a space.

The MEMS resonator can be operated at its parallel resonance frequency. At this frequency, an acoustic wave is propagated laterally away from a central region of the MEMS resonator through a substrate of the MEMS resonator. By using concentric resonant confiners, the propagating acoustic wave is attenuated. The concentric confiners surround the perimeter of the first electrode and are attached to the top surface of the piezoelectric member.

BRIEF DESCRIPTION OF THE DRAWINGS

FIGS. 3A, 3B illustrates vibration within a MEMS resonator device in serial resonance and parallel resonance, respectively.

FIG. 5A is a cross section of a MEMS device that includes resonant confiners.

DETAILED DESCRIPTION OF EMBODIMENTS

Figure 1:
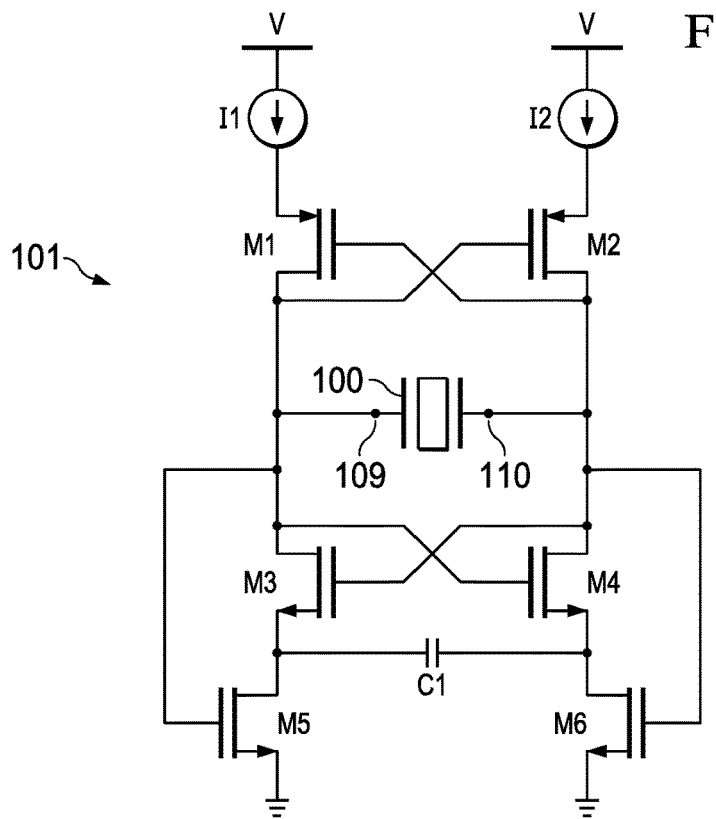
FIG. 1 is a schematic of an example oscillator circuit that includes a MEMS acoustic wave resonator device.

In the drawings, like elements are denoted by like reference numerals for consistency.

Microelectronic devices that include frequency selective components are important for many electronic products requiring stable frequency signals or ability to discriminate between signals based on frequency diversity. For resonant MEMS (microelectromechanical systems) devices, stability is important for good performance.

In thickness mode piezoelectric resonators, such as Bulk Acoustic Wave (BAW), Solidly Mounted Resonators (SMR), and Film Bulk Acoustic Resonators (FBARs), the parallel resonance frequency ($f_p$) exhibits a highly-dispersive mode of vibration whose vertical component shows large propagation in the lateral direction. As a result, this lateral energy leakage can affect the resonator quality factor at $f_p$ ($Q_p$), which is defined as the ratio of energy stored over the energy lost per cycle of vibration. In the case of small devices, the energy lost becomes dominated by acoustic losses. $Q_p$ is proportional to the resonator area over its perimeter.

As will be described in more detail hereinbelow, patterned resonant confiners placed around the electrode of a thickness mode piezoelectric resonator mitigate the amount of lateral acoustic energy leakage. For efficient energy confinement, the width and separation of the metal strip lines forming the resonant confiners can be $\lambda/2$, where $\lambda$ represents the lateral wavelength of the propagating acoustic wave leaving the resonator at the parallel frequency. The resonant confiners are placed within the area of vibration, which is delimited by the Bragg mirrors in the case of BAW and SMR devices, and the released region in the case of a FBAR device.

One way to improve $Q_p$ as well as suppressing spurious modes near $f_p$, is to use a $\lambda/4$ acoustic frame constructed at the edge of the first electrode. This technique relies on the ability of acoustic frames working as $\lambda/4$ transformers to reflect the propagating lateral waves.

In the examples described herein, resonant confiners are separated from the top electrode and their dimensions (linewidth and separation) are equivalent to $\lambda/2$. One advantage of using resonant confiners instead of acoustic frames is that a resonant confiner is not constrained by the electrode, whose dimensions are set by other criteria such as required dielectric capacitance or matching network conditions. As a result, the number of resonant confiners can be increased up to the point in which the vertical displacement becomes highly attenuated, minimizing the amount of energy leakage and improving $Q_p$.

FIG. 1 is a schematic of an oscillator circuit example 101 that uses a MEMS acoustic wave resonator 100 that includes one or more resonant confiners. In this example, oscillator circuit 101 is implemented on a semiconductor substrate using complimentary metal-oxide semiconductor (CMOS) transistors, for example. In this example, current sources I1, I2 provide a constant current to cross coupled differential pair PMOS transistors M1, M2 and cross coupled differential pair NMOS transistors M3, M4. MEMS acoustic wave resonator 100 acts as an L-C tank circuit. NMOS transistors M5, M6, and capacitor C1 may be needed to reduce gain at low frequencies. MEMS acoustic wave resonator 100 may look like a capacitor at low frequency, but will look like an open circuit at DC (direct current) and the circuit might actually latch without the aid of transistors M5, M6.

MEMS acoustic wave resonator 100 includes a piezoelectric material sandwiched between two electrodes and acoustically isolated from the surrounding medium. MEMS acoustic wave resonator devices using piezoelectric films with thicknesses ranging from several micrometers down to tenth of micrometers resonate in the frequency range of roughly 100 MHz to 10 GHz. Aluminum nitride and zinc oxide are two common piezoelectric materials used in MEMS acoustic wave resonators.

In this example, MEMS acoustic wave resonator 100 is implemented on a semiconductor substrate that is separate from the semiconductor substrate on which oscillator circuit 101 is fabricated. MEMS acoustic resonator 100 may be mounted on the CMOS oscillator chip. Bond wires may be used to connect MEMS resonator terminals 109, 110 to bond pads on the CMOS oscillator chip. In another example, a MEMS acoustic wave resonator similar to MEMS acoustic wave resonator 100 may be fabricated on the same substrate that includes an oscillator circuit.

Figure 2:
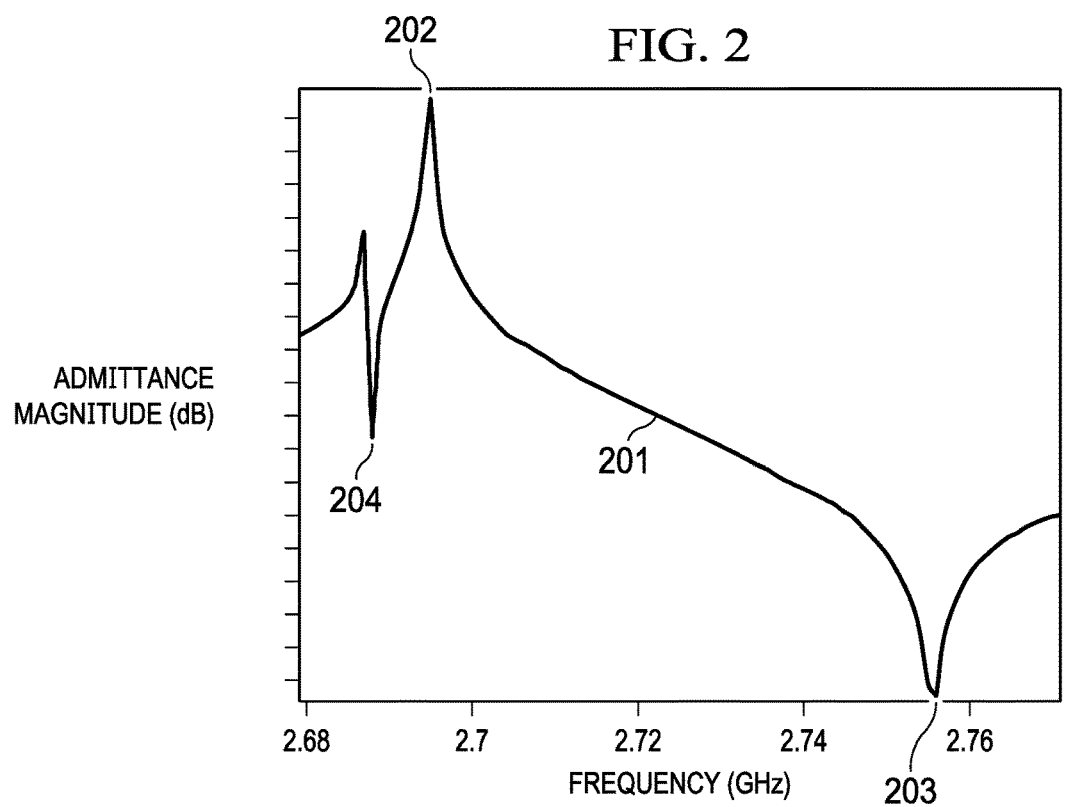
FIG. 2 is a plot illustrating frequency response of a MEMS acoustic wave resonator device.

FIG. 2 is a plot 201 illustrating a typical frequency response of a MEMS acoustic wave resonator device expressed as admittance (dB) vs frequency. Admittance is the reciprocal of impedance and is a measure of how easily an electrical current can flow through a device. For a MEMS acoustic wave resonator device, a point of high admittance is referred to as the series resonance point, as illustrated at 202, while a point of low admittance is referred to as the parallel resonance point, as illustrated at 203.

A typical MEMS acoustic wave resonator includes two electrodes positioned on opposite sides of a piezoelectric layer, similar to a capacitor. A thin Film Bulk Acoustic Resonator (FBAR) is a fully released structure and requires cavities below and above the resonator. A Solidly Mounted Resonator (SMR) uses an acoustic reflector, also referred to as an "acoustic mirror," below the bottom electrode to prevent acoustic energy from leaking to the substrate. A BAW device includes two acoustic mirrors, one on each side of the piezoelectric layer and electrodes.

In a BAW resonator, the series resonance frequency ($f_s$) coincides with the thickness extensional (TE) mode near cut-off frequency. If the group velocity displayed by the TE mode is positive the resonator is defined as a Type I device. On the other hand, if the group velocity displayed by the TE mode is negative the resonator is defined as a Type II device.

Plot 201 shows the resonance responses of a typical Type II resonator. A device that uses an aluminum nitride (AlN) piezoelectric acoustically isolated from the substrate is naturally a Type II device, with spurious modes (ripples) 204 below the series resonance ($f_s$). The existence of these ripples in the vicinity of parallel resonance frequency $f_p$ 203 is undesirable in many applications. Any ripples around the parallel resonance can cause the $Q_p$ (quality factor around $f_p$) and $Z_p$ (Impedance around $f_p$) to vary and thus may cause variation in the system performance.

FIGS. 3A, 3B illustrates simulated vibration within a MEMS resonator device 300 in serial resonance and parallel resonance, respectively. This simulation illustrates a piezoelectric layer 303 with an upper electrode layer 301 attached to a top side of the piezoelectric layer and a lower electrode layer 302 attached to the opposite side of the piezoelectric layer 303. A multilayer acoustic reflector 304 is formed on top of the upper electrode 301 and a multilayer acoustic reflector 305 is formed on the bottom side of the lower electrode 302.

FIG. 3A illustrates the magnitude of vertical displacement 311 in the upper electrode 301 and vertical displacement 312 in the lower electrode 302 across the active region 314 of the MEMS resonator device 300 at specific instant of time while it is operating at the series resonant frequency. The displacement magnitude is indicated by shading, as shown in scale 313. In series resonance mode, the vertical displacement is non-dispersive and is concentrated inside the active region 314 of the resonator. The magnitude of the vertical displacement is almost zero at the edge 315 of the resonator and at a maximum at the central point of symmetry 316.

FIG. 3B illustrates the magnitude of vertical displacement 321 in the upper electrode 301 and vertical displacement 322 in the lower electrode 302 across the active region 314 of the MEMS resonator device 300 at a specific instant of time while it is operating at the parallel resonant frequency. In parallel resonance mode, the vertical displacement is highly dispersive and induces lateral acoustic wave leakage, as illustrated at the edge 315.

Figure 4B:
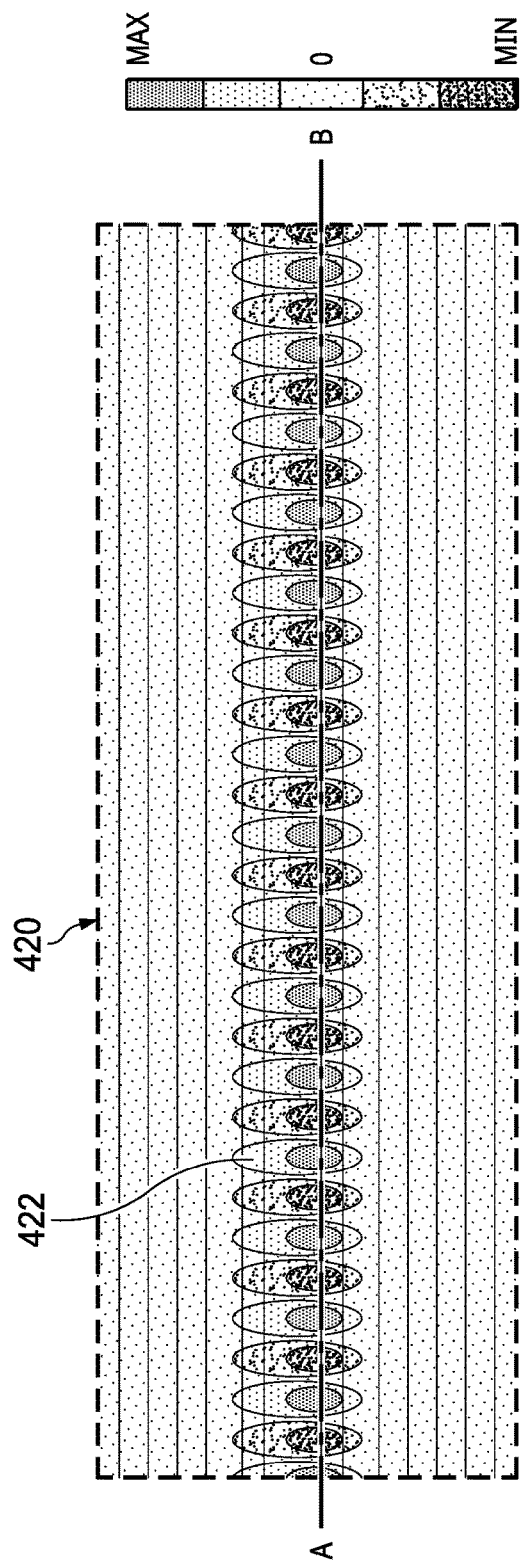
FIGS. 4A-4B are plots illustrating unimpeded lateral wave propagation within a MEMS device in parallel resonance.
Figure 4C:
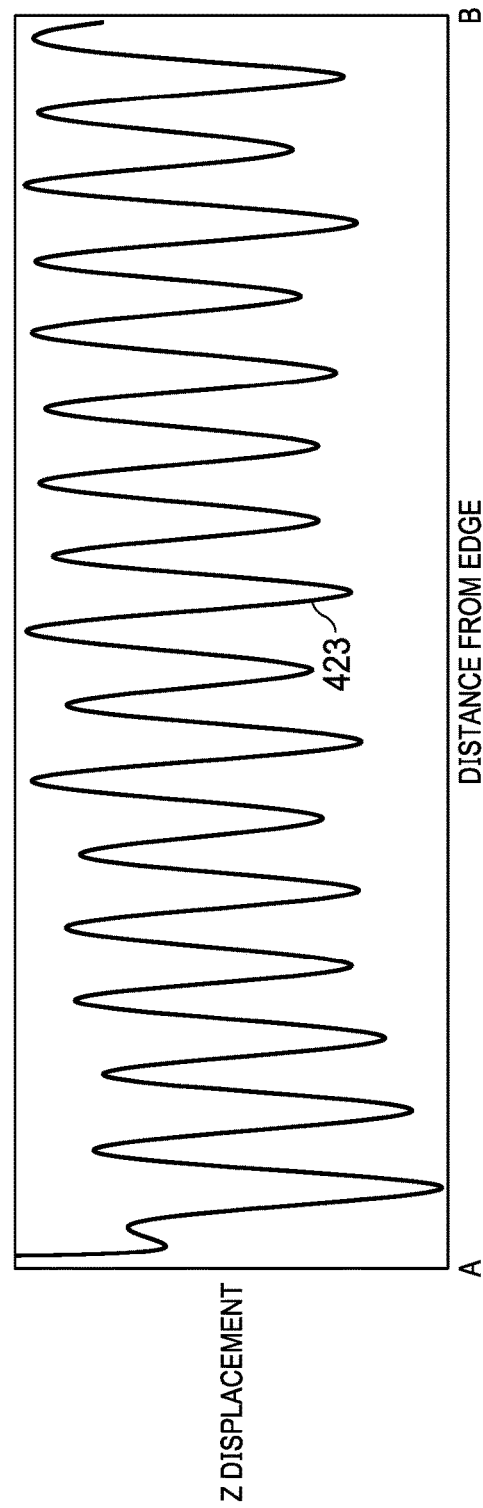

FIGS. 4A-4C are plots illustrating the simulation of FIG. 3B in more detail to illustrate unimpeded lateral wave propagation within a MEMS device in parallel resonance. FIG. 4A illustrates the simulation of FIG. 3B from the point of symmetry 316 to the edge 315. The top electrode 301 ends at perimeter edge 315. Piezoelectric layer 303, lower electrode 302 and acoustic mirrors 304, 305 extend into substrate region 420 beyond the perimeter of the upper electrode 301.

FIG. 4B illustrates substrate region 420 in more detail, in particular it can be seen how a parallel resonance mode lateral wave propagates into substrate 420 with nearly constant vertical displacement, as indicated by plot 423 (FIG. 4C). As a result, this lateral energy leakage can affect the resonator quality factor at $f_p$ ($Q_p$), which is defined as the ratio of energy stored over the energy lost per cycle of vibration. In the case of small devices, the energy lost becomes dominated by acoustic losses ($Q_p$ is proportional to the resonator area over its perimeter).

FIG. 5A is a cross section of a MEMS device 500 that includes a set of resonant confiners 530 that are placed in a region of MEMS device 500 that is separated from upper electrode 301 by a distance (d) 535. MEMS device 500 is similar to MEMS device 300 with the addition of resonant confiners 530 and the various features are therefore labeled with the same reference labels. In this example there are ten individual resonant confiners, such as resonant confiner 531, in the set 530. Another example may include more or fewer individual resonant confiners in a set of resonant confiners. Patterned resonant confiners 530 are placed concentrically around the electrode 301 of thickness mode piezoelectric resonator 500 as a way to mitigate the amount of lateral acoustic energy leakage. For efficient energy confinement, the width (w) 533 and separation (s) 534 of the metal strip lines forming the resonant confiners is selected to be $\lambda/2$, where $\lambda$ represents the lateral wavelength of the propagating acoustic mode leaving the resonator at the parallel frequency. The resonant confiners are located within the area of vibration, which is delimited by the Bragg mirrors in the case of a BAW and a SMR, and the released region in the case of a FBAR device. The resonant confiner nearest to the upper electrode 301 is spaced apart from the perimeter of upper electrode 301 by a distance (d) 535 that is an integer multiple of $\lambda/4$.

As mentioned earlier, another technique used to improve $Q_p$ relies on the ability of acoustic frames to reflect the propagating lateral waves. However, the design of an acoustic frame is substantially different from the design of the resonant confiners described herein; in that acoustic frames are constructed on top of the top electrode at or near the edge of the top electrode and their dimensions are odd multiples of $\lambda/4$. Additional process steps are required to form the acoustic frame on top of the electrode. The resonant confiners described herein are separated from the top electrode and their dimensions (linewidth and separation) are equivalent to $\lambda/2$. The thickness of the resonant confiners can be the same as the thickness of the electrode. The resonant confiners therefore can be fabricated with the same process steps that form the top electrode.

Figure 5B:
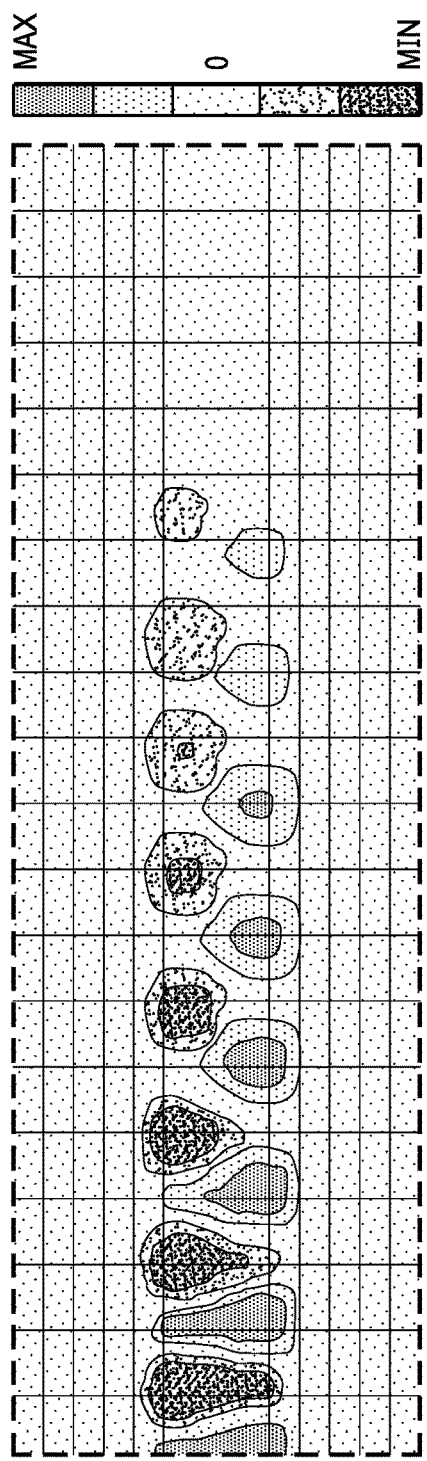
FIGS. 5B, 5C are plots illustrating attenuated lateral wave propagation within the MEMS device of FIG. 5A in parallel resonance using resonant confiners.
Figure 5C:
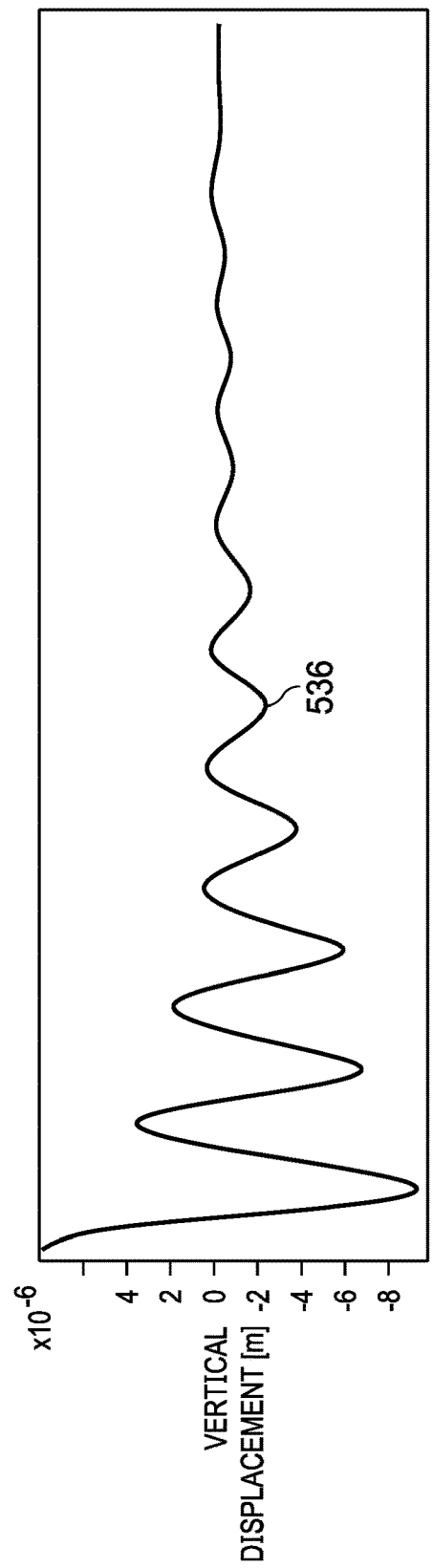

FIG. 5B is an enhanced view of the mode shape of the laterally propagating acoustic wave displayed within the confiners' region at the parallel resonant frequency. FIG. 5C is a plot in which plot line 536 illustrates a simulated decay of vertical displacement of the acoustic wave propagating laterally away from the central region of the MEMS device 500 as a result of encountering the ten concentric resonate confiners 531. The mode shape illustrated in FIG. 5B corresponds to a zeroth-order anti-symmetrical mode of vibration, as will be described in more detail with regard to FIGS. 7A-7C. An advantage of using resonant confiners instead of acoustic frames is that resonant confiners are not constrained by the electrode, whose dimensions are set by other criteria such as required dielectric capacitance or matching network conditions. As a result, the number of resonant confiners can be increased up to the point in which the vertical displacement becomes highly attenuated, minimizing the amount of energy leakage and improving $Q_p$. In this example, by properly selecting the $\lambda/2$ and number of confiners (ten pairs in the example), the mode shape as illustrated in FIG. 5B and vertical displacement 536 as illustrated in FIG. 5C inside the resonant confiners' region 530 decay to essentially zero. As a result, the acoustic energy that couples into the perfectly matched layer (PML) region 520 representing the MEMS device substrate is almost negligible.

Figure 6A:
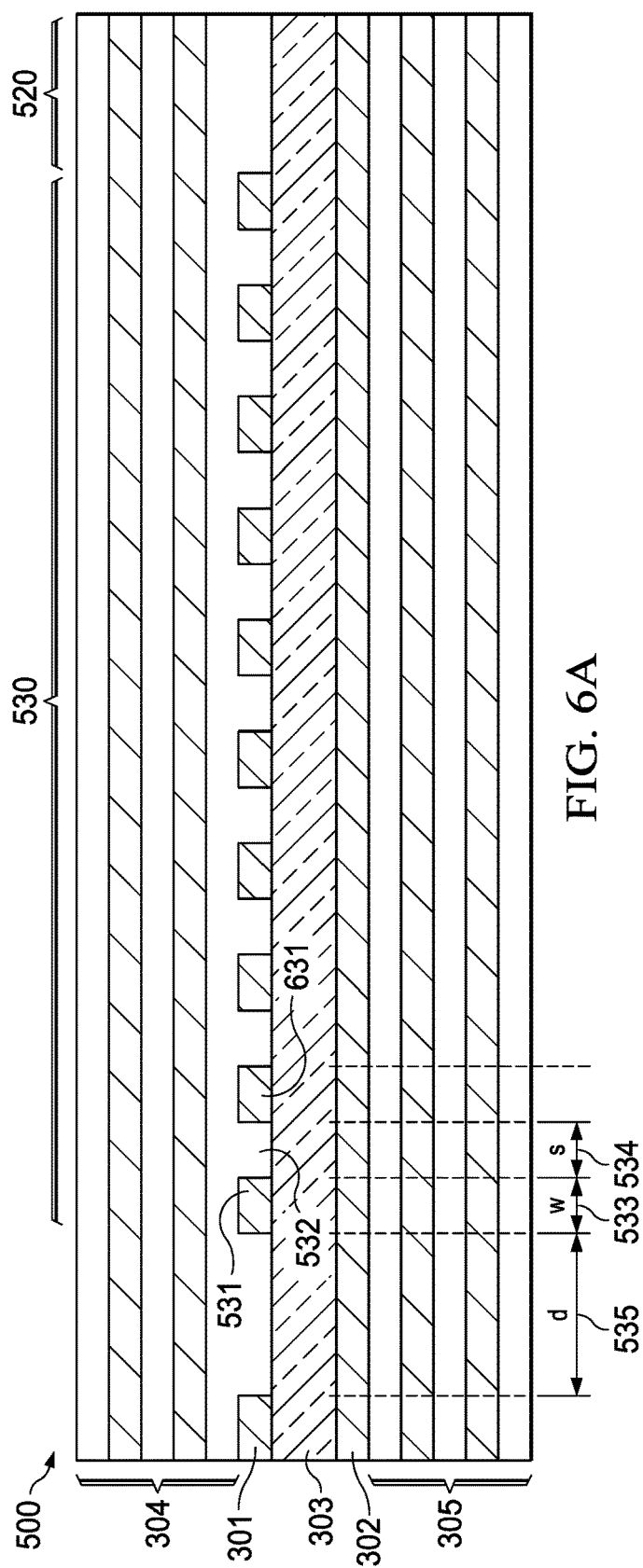
FIG. 6A is an expanded cross section of a portion of the resonant confiner region of the MEMS device of FIG. 5A.
Figure 6B:
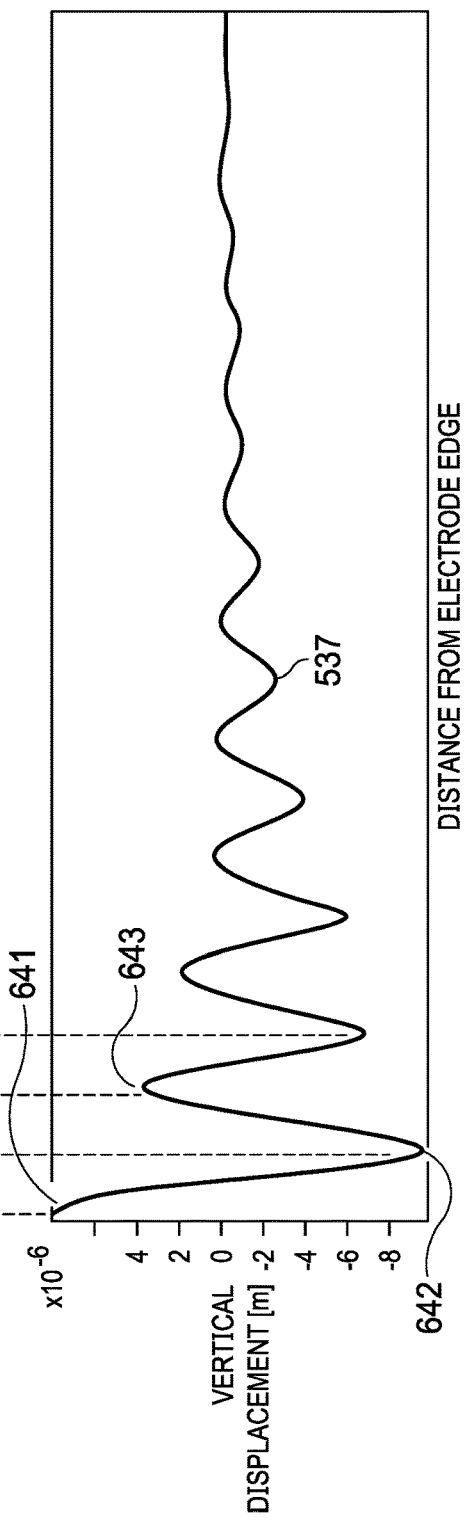
FIG. 6B is an expanded version of the plot of FIG. 5C.

FIG. 6A is an expanded cross section of a portion of the resonant confiner region 530 of the MEMS device of FIG. 5A. FIG. 6B is an expanded view of the plot 537 of FIG. 5C. The width w 533 of each strip 531 and the width of the space s 534 between each strip (such as strip 531 and strip 631) is selected to match the wavelength of a complete cycle of the lateral waveform 537. In this example, the maximal point 641 of waveform 537 occurs at the edge of resonant confiner 531 closest to upper electrode 301 and the minimal point 642 occurs at the edge of resonant confiner 531 furthest from upper electrode 301. The magnitude of waveform 537 rises from minimal point 642 to maximal point 643 at the edge nearest the upper electrode 301 of the next resonant confiner 631. This pattern of maximal and minimum points of waveform 537 coinciding with an edge of the respective resonant confiners continues for the whole set of resonant confiners 530 until the magnitude is attenuated to essentially nothing. In another example, the waveform may be inverted such that a minimal point coincides with the edge of resonant confiner 531 closest to electrode 301, as determined by the size L of electrode 301 and separation distance d 535.

In this manner, a lateral acoustic wave that is propagating laterally away from the active region of electrode 301 is essentially "locked" into position by the set of resonant confiners 530 so that the loss of energy from MEMS resonator 500 is minimized.

Figure 7A:
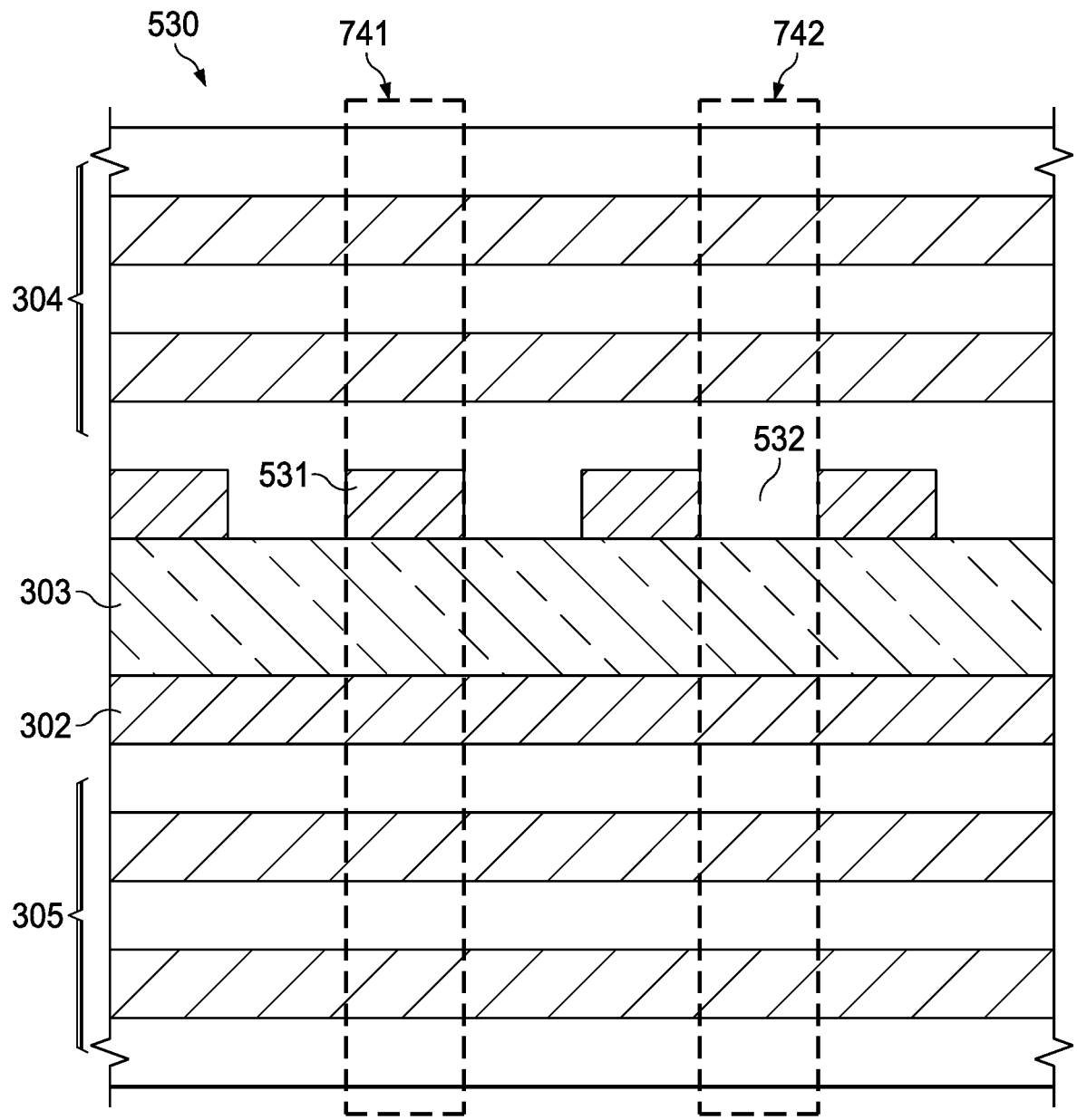
FIG. 7A is an expanded cross section of a portion of the resonant confiner region of the MEMS device of FIG. 5A.

FIG. 7A is an expanded cross section of a portion of the resonant confiner region of the MEMS device of FIG. 5A. To achieve the displacement decay necessary to improve $Q_p$, the width and separation of the metal strip lines forming the resonant confiners need to be selected based on the mode of vibration exhibited in the substrate at $f_p$ (FIG. 3B). Thus, the periodicity of this mode will determine the wavelength of the propagating lateral wave and will be used as a guideline to determine the $\lambda/4$ and $\lambda/2$ values. However, the $\lambda$ value will change depending on the material composition of the propagation regions. To find those values the dispersion characteristics of non-metallized and metallized regions, which can be easily simulated by using Finite Element Methods (FEM).

The propagation velocity of a wave depends on the material that it is propagating through. In order to determine an optimum width 533 (FIG. 5A) of each of the resonant confiners, such as resonant confiner 531, in set 530 and an optimum separation 534 (FIG. 5A) between each of the metal striplines that form the resonant confiners, such as space 532, two different studies need to be done. A block of material 741 that includes a metal layer (that can be formed into a strip line such as resonant confiner 531) and all of the other layers that make up the substrate of MEMS device 500 is simulated to determine the vibrations modes of a signal that may propagate in the metalized region of each resonant confiner. A block of material 742 that does not include a metal layer for resonant confiners and all of the other layers that make up the substrate of MEMS device 500 is simulated to determine the vibration modes of a signal that may propagate in the non-metalized region between each resonant confiner.

Figure 7B:
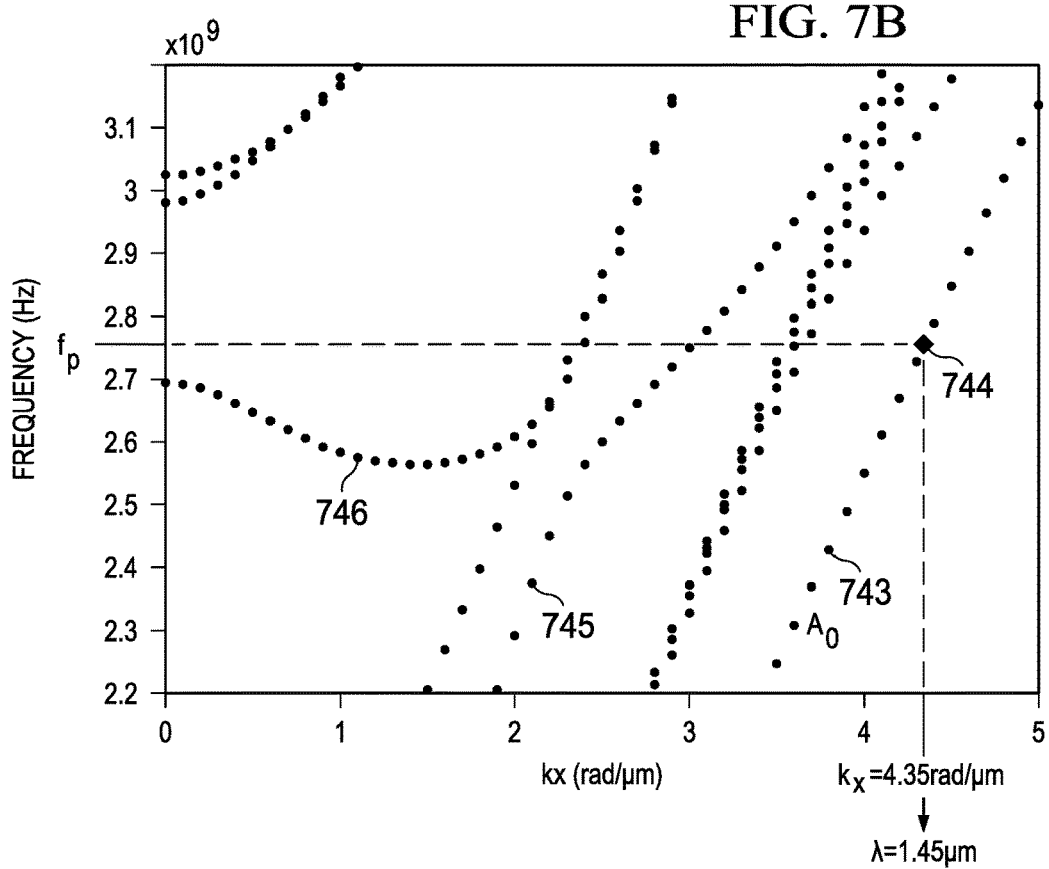
FIGS. 7B, 7C are dispersion diagrams for metalized and non-metalized regions forming the resonant confiners illustrated in FIG. 7A, respectively.
Figure 7C:
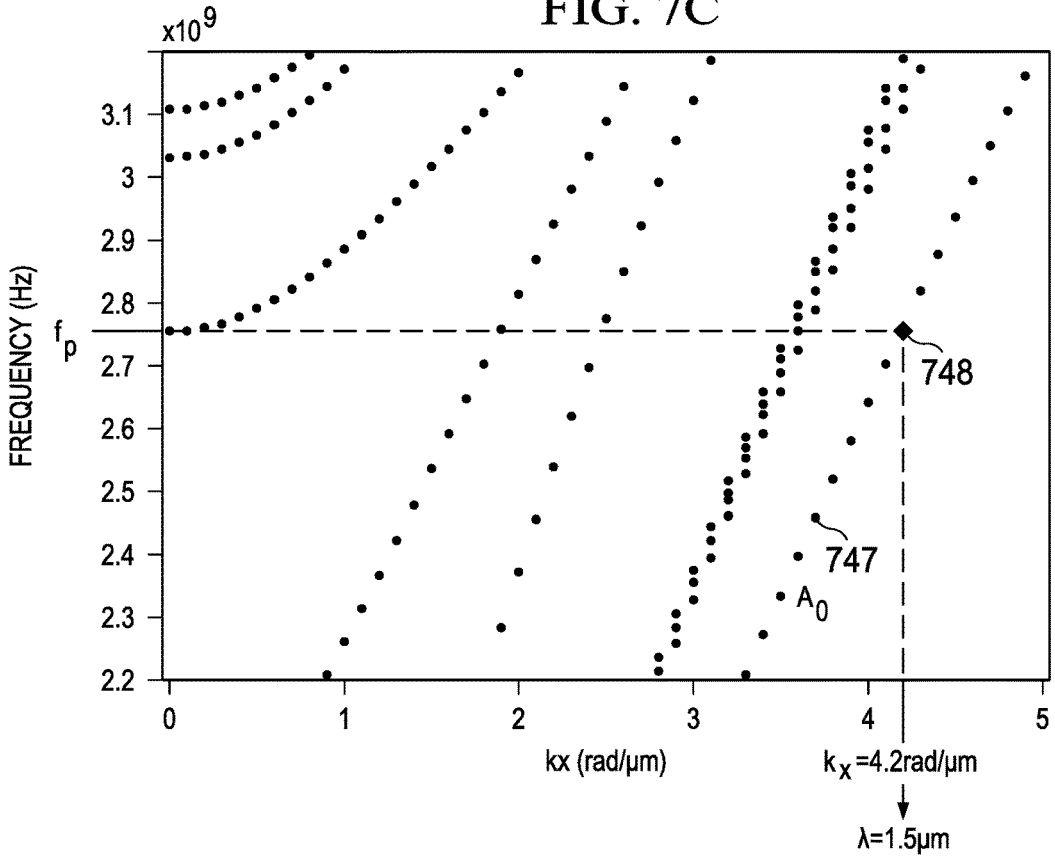

FIGS. 7B, 7C are dispersion diagrams for metalized region 741 and non-metalized region 742 illustrated in FIG. 7A, respectively. In this example, the dispersion characteristics of each region 741, 742 is determined by separate finite element simulations. The dotted line plots represent the dispersion characteristic of the two material stacks given in the confiner structure, which are formed by either the metalized and the non-metalized region. The various dotted line plots illustrate what modes of vibrations (or eigenfrequencies) are possible assuming the specific layer thicknesses and composition of the materials. The general forms of the wave equation that apply to longitudinal and shear waves are given by expressions (1) and (2), respectively. In these expressions, $k_y$ represents the transversal component of the wavenumber, $k_x$ represents the longitudinal component of the wavenumber or propagation factor, $\omega$ represents the resonance frequency, and $V_l$ and $V_s$ represent the longitudinal and shear velocities, respectively. The wavenumber is defined as the number of radians per unit distance. The relationship between $k_x$ and the propagation wavelength ($\lambda$) is given by expression (3).

$$k_y^2 = \left(\frac{\omega}{V_l}\right)^2 - k_x^2 \quad (1)$$

$$k_y^2 = \left(\frac{\omega}{V_s}\right)^2 - k_x^2 \quad (2)$$

$$k_x = \frac{2\pi}{\lambda} \quad (3)$$

The $A_0$ plot corresponds to the zeroth-order antisymmetric mode and $k_x$ represents the wavenumber that relates to the propagation wavelength ($\lambda$). The other dotted plot lines represent other modes of vibration that are possible within the simulated regions 741, 742. For example, plot line 745 represents the zeroth-order symmetrical mode, while plot line 746 represents the first-order symmetrical mode. The remaining plot lines represent various known modes of acoustic vibration that are possible in the simulated stack-up of materials.

Each mode of vibration has a characteristic mode shape that allows the type of vibration to be identified. For a given structure, the size, shape and various constraints on the structure will cause a particular mode of vibration to dominate. Referring back to FIGS. 4A and 5B, the shape of the simulated vibration illustrated therein is characteristic of a zeroth-order antisymmetric mode of vibration. This indicates that acoustic waves propagating in the substrate of MEMS device 500 are using a zero-order antisymmetric mode of vibration.

Referring now to FIG. 7B, assume that MEMS device 500 is designed to have an $f_p$ of 2.75 GHz. The star 744 indicates the value of $k_x$ specific to the $A_0$ mode that is observed (via 2D FEM simulations) at the parallel frequency of 2.75 GHz in the simulated block of material that includes a metal layer for the resonant confiner strip line. The wave number $k_x$ is equal to 4.35 rad/µm. Using expression (3), this is equal to a propagation wavelength of 1.45 µm. Referring to FIG. 7C, star 748 indicates the value of $k_x$ specific to the A0 mode plot 747 that is observed at the parallel frequency of 2.75 GHz in the simulated block of material that does not have a metal layer for the resonant confiner strip. The wave number $k_x$ is equal to 4.2 rad/µm. Using expression (3), this is equal to a propagation wavelength of 1.5 µm.

As discussed above with regard to FIG. 6A, 6B, the width of the stripline that forms each resonant confiner 531 should be $\lambda/2$ and the separation between each stripline should be $\lambda/2$. As can be seen from FIGS. 7B and 7C, the wavelength is actually slightly different in the regions that are in the shadow of the resonant confiner striplines as opposed to the spaces between the striplines. Thus, in this example, the width 533 of the striplines 531 should be set to 1.45 µm/2=0.725 µm, while the separation 534 between the striplines should be set to 1.5 µm/2=0.75 µm.

Figure 8:
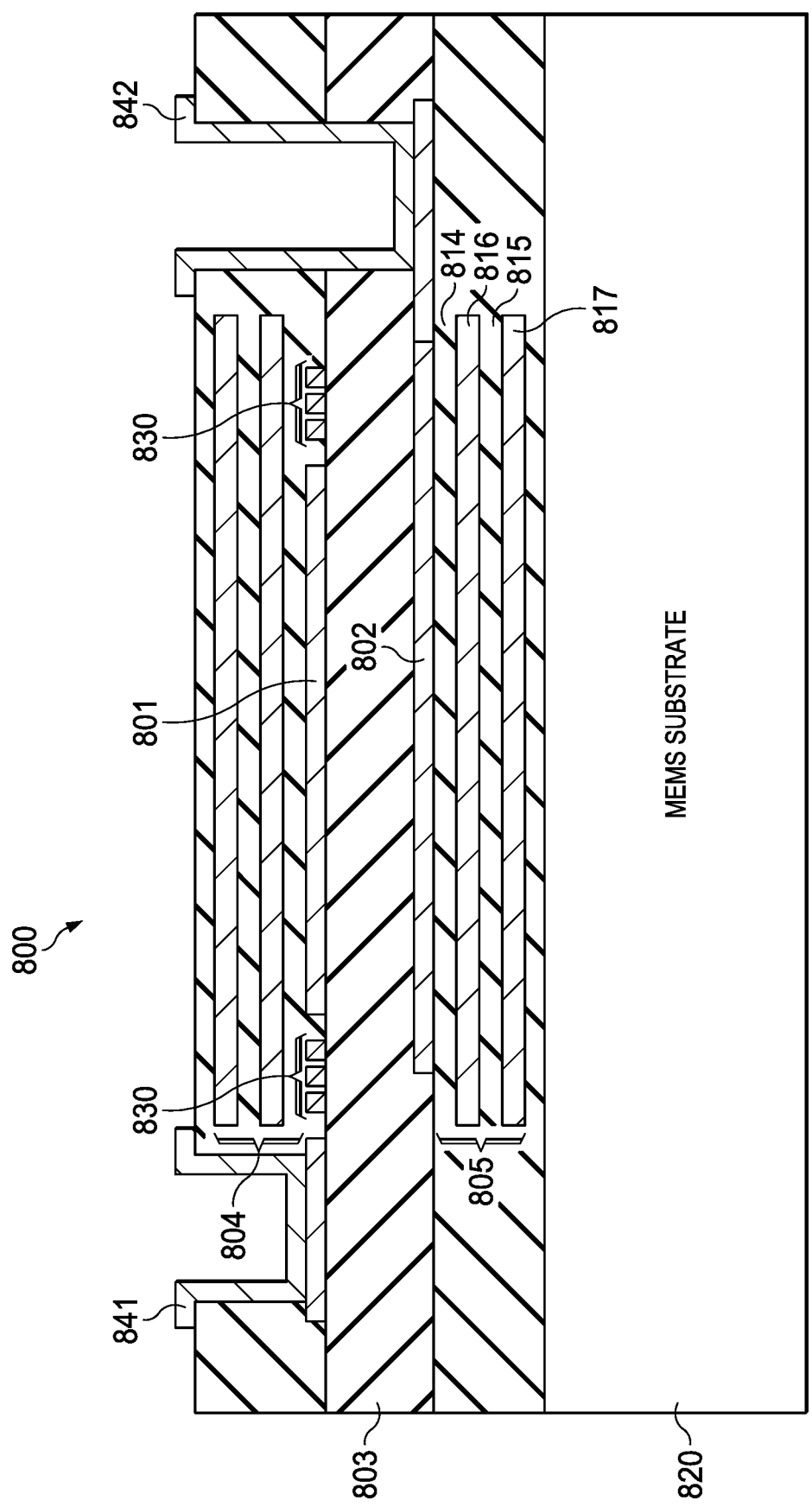
FIG. 8 is cross sectional view of an example Bulk Acoustic Wave (BAW) resonator device having resonant confiners.

FIG. 8 is cross sectional view of an example MEMS Bulk Acoustic Wave (BAW) resonator device 800 having a set of resonant confiners 830 that are spaced apart from upper electrode 801. The set of resonant confiners 830 are arranged around the periphery of upper electrode 801 in a concentric manner. BAW resonator 800 includes an upper electrode 801 and a lower electrode 802, which are separated by a piezoelectric member 803. BAW resonator 800 may be fabricated directly on substrate 820 using known or later developed semiconductor fabrication techniques.

In this example, BAW acoustic wave resonator 800 uses an acoustic reflector 805 at the bottom to prevent acoustic energy, propagating in the vertical direction, from leaking into substrate 820. A second acoustic reflector 804 located on top of upper electrode 801 isolates the resonator from any other material or specimen that could be in direct contact with its top surface.

In this example, electrodes 801, 802 and resonant confiners 830 are patterned from layers of metal, such as Al, Mo, Cu, Au, etc. Piezoelectric layer 803 is fabricated using various piezo materials, such as AlN, quartz, GaN, ZnO, lithium nobate, etc. A temperature compensating layer of oxide may be formed on top of piezoelectric layer 803, or any position in between the resonator stack. Contacts 841, 842 are in contact with upper electrode 801 and lower electrode 802 respectively and thereby provide contacts for coupling MEMS acoustic wave resonator 800 to an oscillator circuit.

In this example, acoustic reflectors 804, 805 are distributed Bragg reflectors (DBR). A DBR is a structure formed from multiple layers of alternating materials with varying acoustic impedance. Each layer boundary causes a partial reflection of an acoustic wave. For bulk acoustic waves whose wavelength is close to four times the thickness of the layers, the many reflections combine with constructive interference, and the layers act as a high-quality reflector. Any known or later developed Bragg mirror, dielectric mirror, acoustic reflector, etc. may be used to implement the acoustic reflector 804, 805. The example acoustic reflector 805 includes alternating layers of materials with different acoustic impedances. In some examples, acoustic reflector 805 includes: (a) alternating flat conductive members (e.g., layers, sheets, plates, etc. of metal), two of which are designated by reference numerals 816 and 817; and (b) flat dielectric members (e.g., layers, sheets, plates, etc. of a dielectric material), two of which are designated by reference numerals 814 and 815. The thicknesses of and distances between the conductive members 815 and 814 are selected based on an intended resonance frequency of the BAW resonator 800. As a result, the acoustic reflector 805 reduces spurious modes, and it confines (such as by reflecting, directing, containing, etc.) acoustic energy of the main mode at that frequency in piezoelectric layer 803 and the two electrodes 801 and 802 which together act as a resonant cavity of the BAW resonator 800. In some examples, the conductive members 816, 817 are formed by tungsten (W), titanium tungsten (TiW) or copper (Cu). In some examples, the dielectric members 814, 815 are formed by silicon dioxide ($SiO_2$), or a carbon doped oxide dielectric (such as SiCOH), or aluminum nitride (AlN). In some examples, the acoustic reflector 805 may be implemented using a two-dimensional (2D) or a three-dimensional phononic crystal. Bottom electrode 802 may be formed in contact with the adjacent Bragg mirror 805.

Acoustic mirror 804 is constructed in a similar manner to acoustic mirror 805. In some examples, confining main mode acoustic energy refers to confining a portion of the main mode of acoustic energy. In this manner, the quality factor (Q) of the MEMS acoustic wave resonator 800 is increased and, in turn, the performance of a system including the example MEMS acoustic wave resonator 800 is improved.

Figure 9:
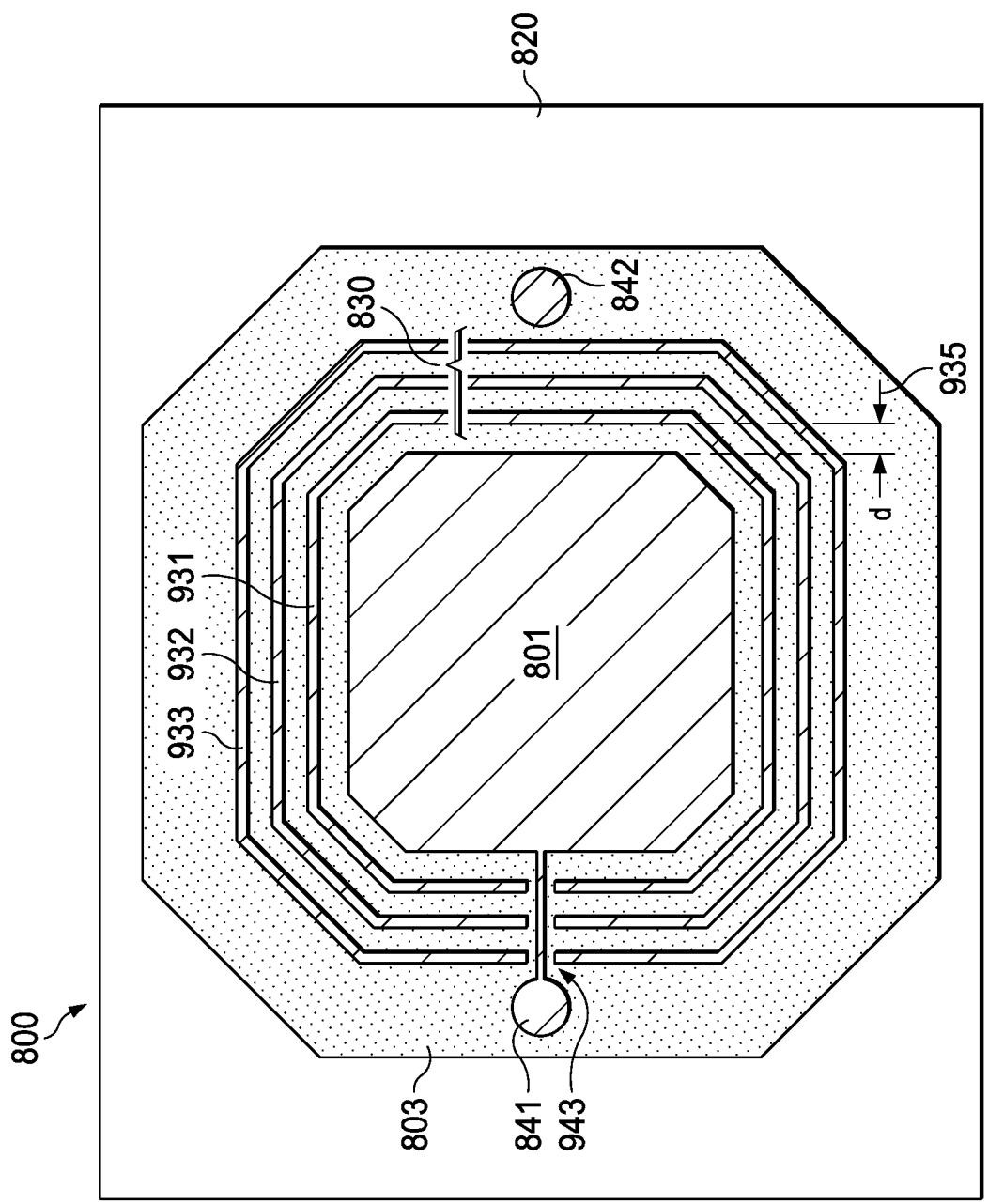
FIGS. 9-11 are alternate examples of a top view of the BAW device of FIG. 7.

FIG. 9 is a top view of the example MEMS acoustic wave resonator device 800 of FIG. 8. The set of resonant confiners 830 encircles the top electrode 801 and is separated from the perimeter edge of electrode 801 by a defined distance d. The concentric periodically spaced resonant confiners 931, 932, 933 likewise encircle the top electrode 801. In this example, a gap 943 is provided in each resonant confiner stripline to allow contact 841 to be in contact with upper electrode 801.

In this example, only three resonant confiners are illustrated for clarity. In other examples, a larger number of concentric resonant periodically spaced resonant confiners may be implemented to further attenuate lateral wave propagation. For example, in some embodiments ten or more concentric resonant periodically spaced resonant confiners may be implemented.

Figure 10:
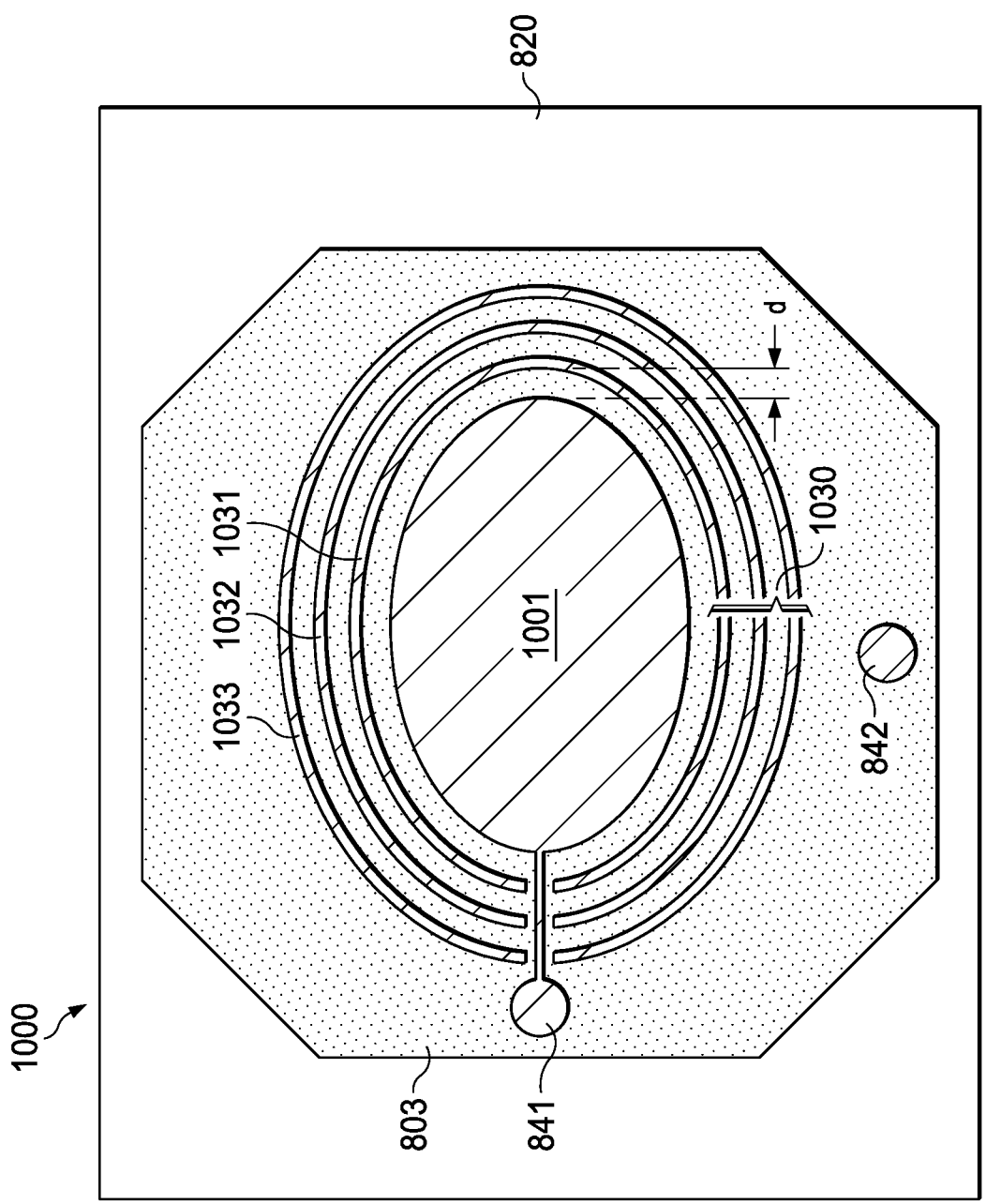

FIG. 10 is another example of a top view of an example MEMS acoustic wave resonator 1000 that is similar to MEMS acoustic wave resonator 800 of FIG. 8. In this example, the upper electrode 1001 is oval shaped and the set of resonant confiners 1030 have a similar oval shape and are concentrically periodically spaced around upper electrode 1001. In this example, only three resonant confiners are illustrated for clarity. In other examples, a larger number of concentric resonant periodically spaced resonant confiners may be implemented to further attenuate lateral wave propagation. For example, in some embodiments ten or more concentric resonant periodically spaced resonant confiners may be implemented.

Figure 11:
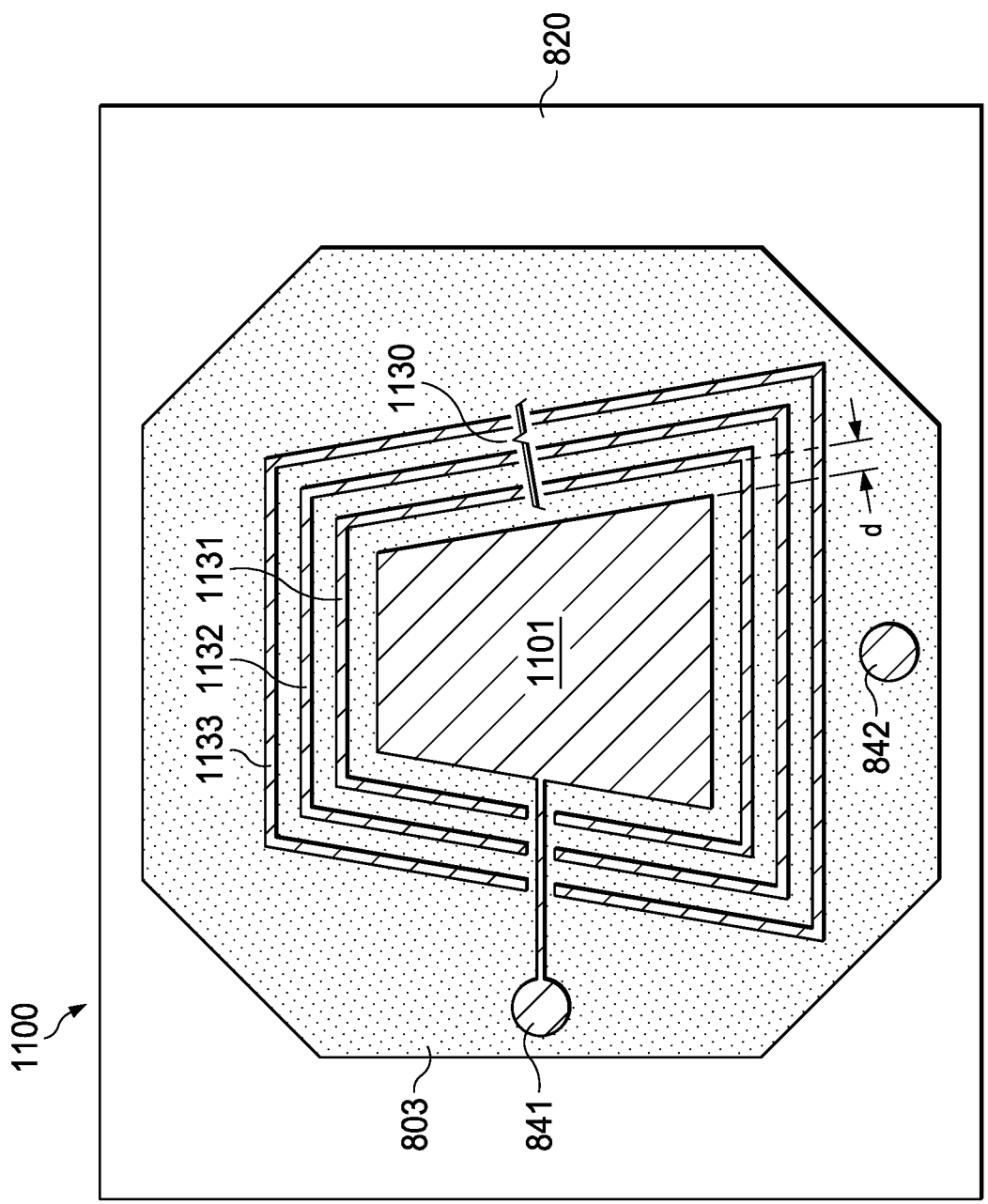

FIG. 11 is another example of a top view of an example MEMS acoustic wave resonator 1100 that is similar to MEMS acoustic wave resonator 800 of FIG. 8. In this example, the upper electrode 1101 is polygon shaped and the set of resonant confiners 1130 have a similar polygon shape and are concentrically periodically spaced around upper electrode 1101. In this example, only three resonant confiners are illustrated for clarity. In other examples, a larger number of concentric resonant periodically spaced resonant confiners may be implemented to further attenuate lateral wave propagation. For example, in some embodiments ten or more concentric resonant periodically spaced resonant confiners may be implemented.

In other examples, the upper electrode may have various shapes, such as round, square, triangular, etc. In each case, a set of resonant confiners is spaced apart from the perimeter of the upper electrode and concentrically periodically spaced around the upper electrode.

Figure 12:
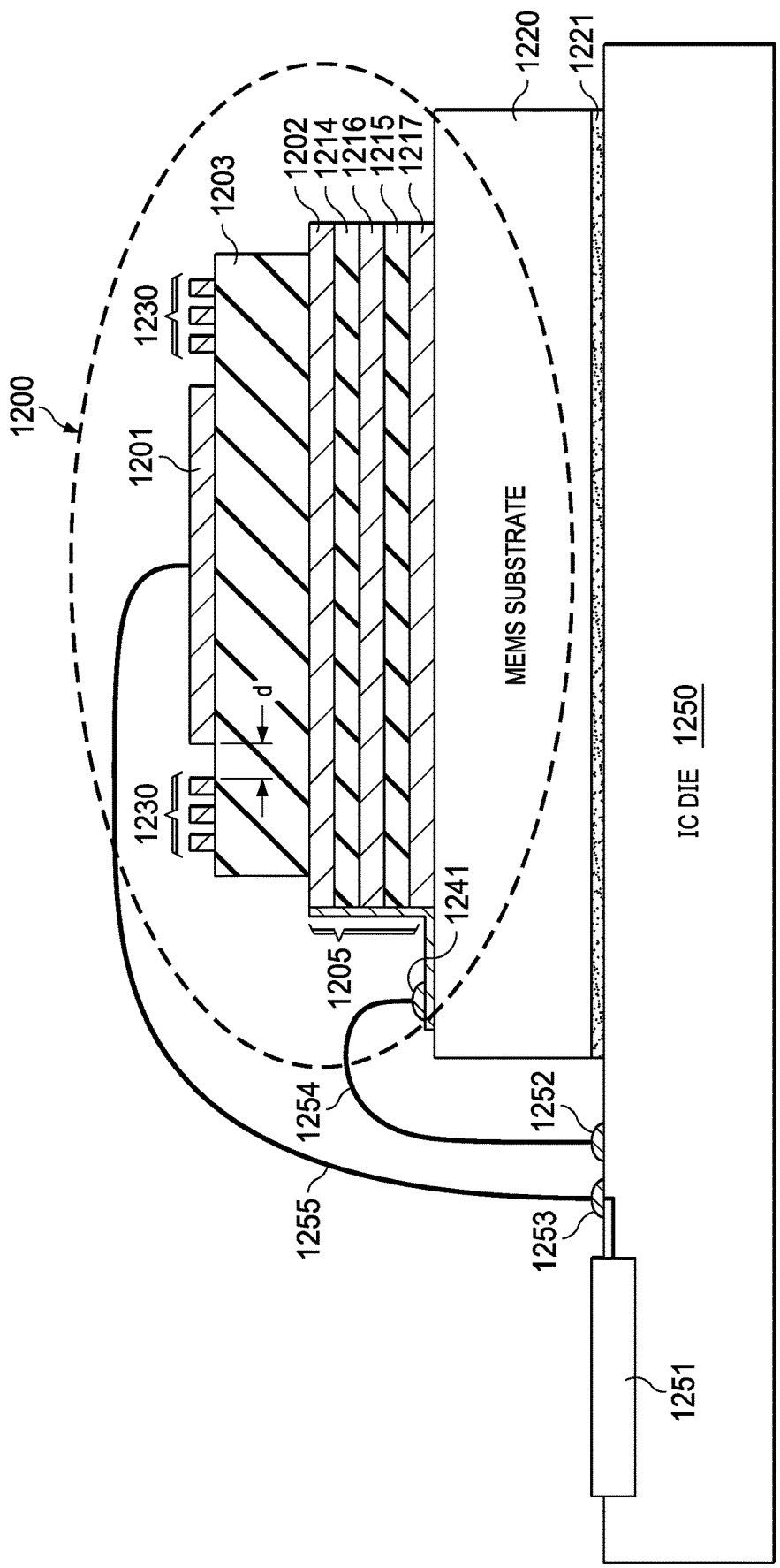
FIG. 12 is cross sectional view of an example Solidly Mounted Resonator (SAR) device having resonant confiners.

FIG. 12 is cross sectional view of an example MEMS solidly mounted resonator (SMR) device 1200 having a set of resonant confiners 1230 that are spaced apart from upper electrode 1201. The set of resonant confiners 1230 are arranged around the periphery of upper electrode 1201 in a concentric manner. SMR resonator 1200 includes an upper electrode 1201 and a lower electrode 1202, which are separated by a piezoelectric member 1203. Similar to MEMS device 800 (FIG. 8), a set of resonant confiners 1230 encircles top electrode 1201 and is spaced away from the perimeter edge of electrode 1201 by a distance d, equal to $n\lambda/4$. Each resonant confiner of the set 1230 has a width that is $\lambda/2$ of $f_p$ in the metalized region and each resonant confiner of the set 1230 is separated from the adjacent resonant confiner by a space of $\lambda/2$ of $f_p$ in the non-metalized region, as discussed in more detail above with reference to FIG. 6A. In this example, only three resonant confiners are illustrated for clarity. In other examples, a larger number of concentric resonant periodically spaced resonant confiners may be implemented to further attenuate lateral wave propagation. For example, in some embodiments ten or more concentric resonant periodically spaced resonant confiners may be implemented.

SMR resonator 1200 may be fabricated directly on substrate 1220 using known or later developed semiconductor fabrication techniques.

In this example, SMR acoustic wave resonator 1200 is a solidly mounted resonator that uses an acoustic reflector 1205 at the bottom to prevent acoustic energy from leaking into substrate 1220.

In this example, electrodes 1201, 1202, and resonant confiners 1230 are patterned from layers of metal, such as Al, Mo, Cu, Au, etc. A piezoelectric member 1203 is positioned between the top electrode 1201 and the bottom electrode 1202. Piezoelectric member 1203, also referred to as a "piezoelectric layer," is fabricated using various piezo materials, such as AlN, quartz, GaN, ZnO, lithium nobate, etc. A temperature compensating layer of oxide may be formed on top of piezoelectric layer 1203, or any position in between the resonator stack.

In this example, acoustic reflector 1205 is a DBR structure similar to acoustic reflector 805 (FIG. 8). In this example, acoustic reflector 1205 includes alternating flat conductive members 1216, 1217 (e.g., layers, sheets, plates, etc. of metal) and flat dielectric members 1214, 1215 (e.g., layers, sheets, plates, etc. of a dielectric material). The thicknesses of and distances between the conductive members of acoustic reflector 1205 are selected based on an intended resonance frequency of the SMR resonator 1200. Any known or later developed Bragg mirror, dielectric mirror, acoustic reflector, etc. may be used to implement the acoustic reflector 1205.

The example MEMS substrate 1220 that includes MEMS resonator 1200 may be attached to another substrate 1250 using a die attach material 1221. Substrate 1250 may be an integrated circuit (IC) die 1250 that includes various semiconductor devices interconnected to perform one or more functions.

The example electrodes 1252 and 1253 may be electrically coupled with other components in an IC package and/or external components. In this example, bond wire 1254 is bonded between bond pad 1241 on MEMS substrate 1220 that is connected to electrode 1202 and bond pad 1252 on IC die 1250. Similarly, bond wire 1255 is bonded between a bond pad (not shown) that is connected to electrode 1201 and bond pad 1253. The electrode 1201 and/or the electrode 1202 may be electrically coupled to circuitry formed within epi layer 1251, such as oscillator circuitry 101 (FIG. 1). The circuitry within epi layer 1251 may include various types of circuits, such as a digital logic circuit, an analog circuit, a processor core, a digital signal processor (DSP) core, etc. In some examples, circuitry in epi layer 1251 controls and/or uses a clock signal generated using the SMR device 1200 to perform one or more functions, such as down conversion, up conversion, modulation, demodulation, etc. In some examples, SMR device 1200 may be coupled with other acoustic resonators of different sizes and frequencies to form a filtering function.

IC die 1250 may be attached to a lead frame or other substrate and then encapsulated, as described in more detail hereinbelow. IC die 1250 and/or one or both electrodes 1201, 1202 may be electrically coupled with bond wires, for example, to external contacts (not shown), such as contacts that may be provided by the lead frame or another substrate on which IC die 1250.

Figure 13:
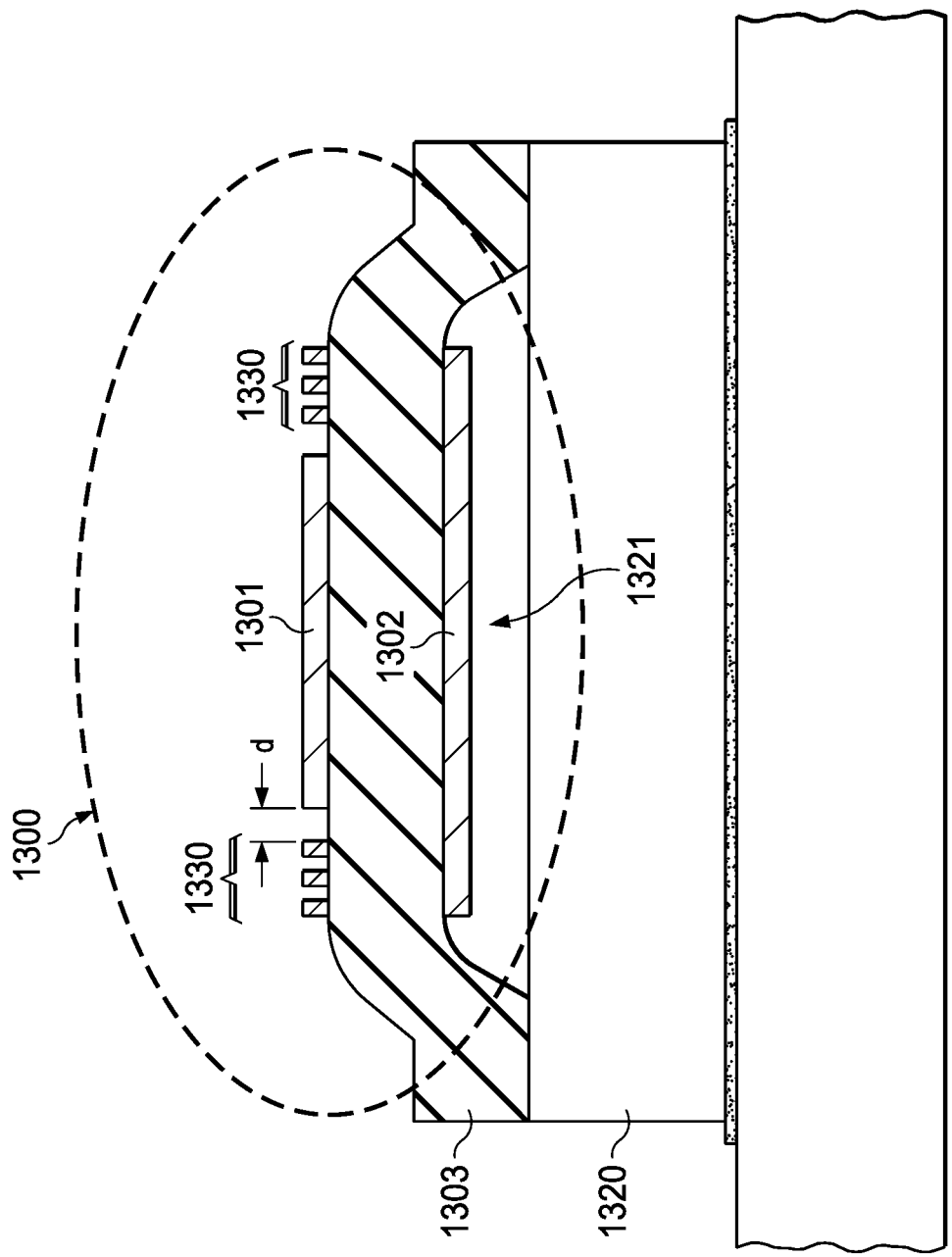
FIG. 13 is cross sectional view of an example Film Bulk Acoustic Resonator (FBAR) device having resonant confiners.

FIG. 13 is a cross section view another example MEMS acoustic wave resonator 1300 that is a fully released resonator structure, referred to as a "film bulk acoustic resonator" (FBAR). FBAR 1300 includes a piezoelectric member 1303 with an electrode 1302 formed on the bottom side and an electrode 1301 formed on the top side. Piezoelectric layer 1303 is formed on substrate 1320 but is separated from substrate 1320 to form a "released volume" 1321 in the active region of MEMS device 1300 to allow the piezoelectric layer to vibrate freely. In this example, an acoustic reflector is not needed. Similar to MEMS device 800 (FIG. 8), a set of resonant confiners 1330 encircles top electrode 1301 and is spaced away from the perimeter edge of electrode 1301 by a distance d, equal to $n\lambda/4$. Each resonant confiner of the set 1330 has a width that is $\lambda/2$ of $f_p$ in the metalized region and each resonant confiner of the set 1330 is separated from the adjacent resonant confiner by a space of $\lambda/2$ of $f_p$ in the non-metalized region, as discussed in more detail above with reference to FIG. 6A. In this example, only three resonant confiners are illustrated for clarity. In other examples, a larger number of concentric resonant periodically spaced resonant confiners may be implemented to further attenuate lateral wave propagation. For example, in some embodiments ten or more concentric resonant periodically spaced resonant confiners may be implemented.

Figure 14:
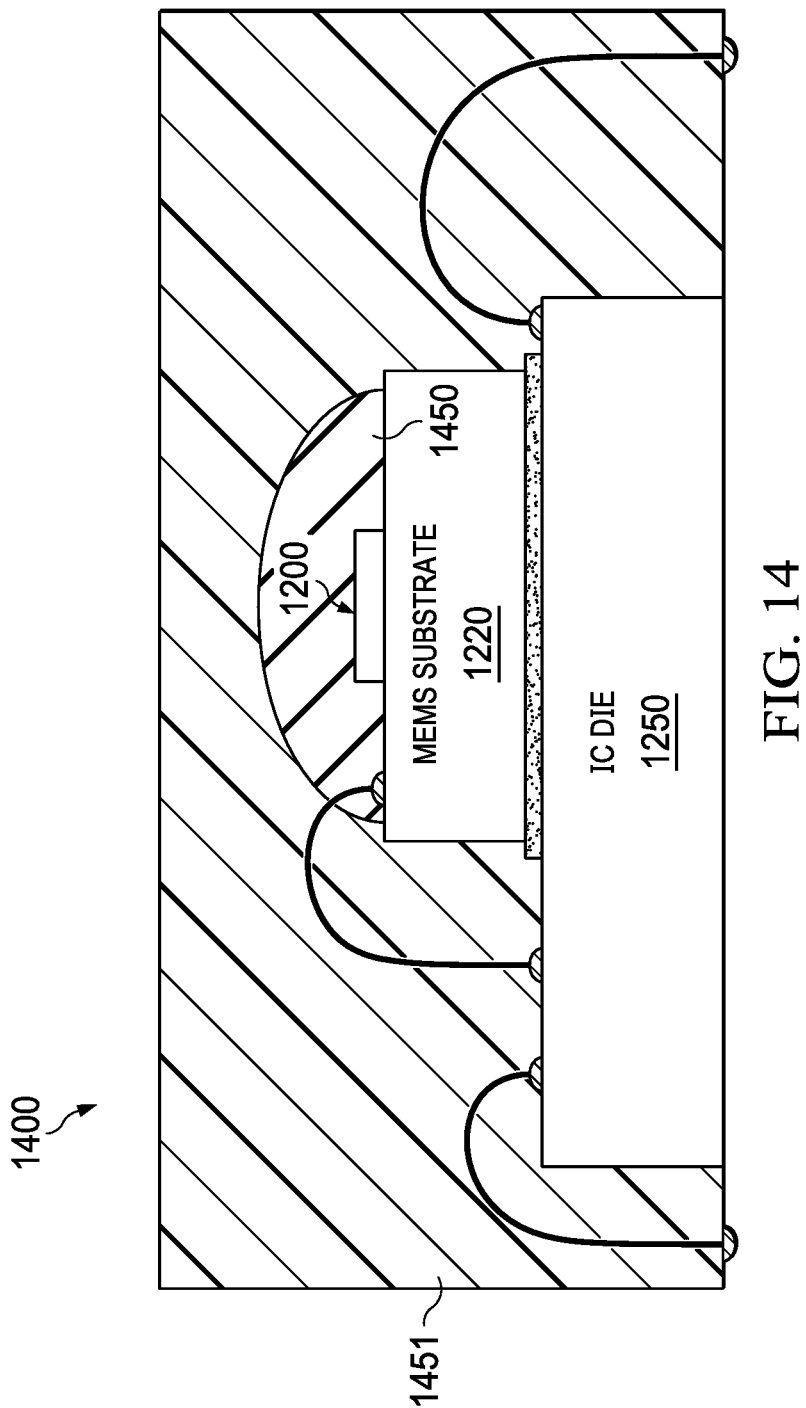
FIG. 14 is a cross sectional view of an example package integrated circuit that includes an example MEMS acoustic wave resonator.

FIG. 14 is a cross sectional view of an example package integrated circuit 1400 that includes the example MEMS resonator 1200 of FIG. 12. IC die 1250 and MEMS die 1200 are encapsulated with mold compound 1451, using a known or later developed encapsulation process.

In this example, a material 1450 that has a low modulus of elasticity may be placed over MEMS resonator 1200 to prevent high modulus mold compound 1451 from touching BAW resonator 1200. In this manner, low modulus material 1450 acts as a stress buffer and provides a stress-free structure for BAW resonator 1200 within an encapsulated package 1400.

In another example, a protective "cavity wafer" or "hard hat" may be placed over MEMS acoustic wave resonator 1200 to prevent mold compound from touching MEMS acoustic wave resonator 1200. IC die 1250 and MEMS die 1200 may then be encapsulated with mold compound using a known or later developed encapsulation process.

Other examples of MEMS resonators, such as MEMS resonator 800 of FIG. 8, or MEMS resonator 1300 of FIG. 13, may be encapsulated in a similar manner.

Figure 15:
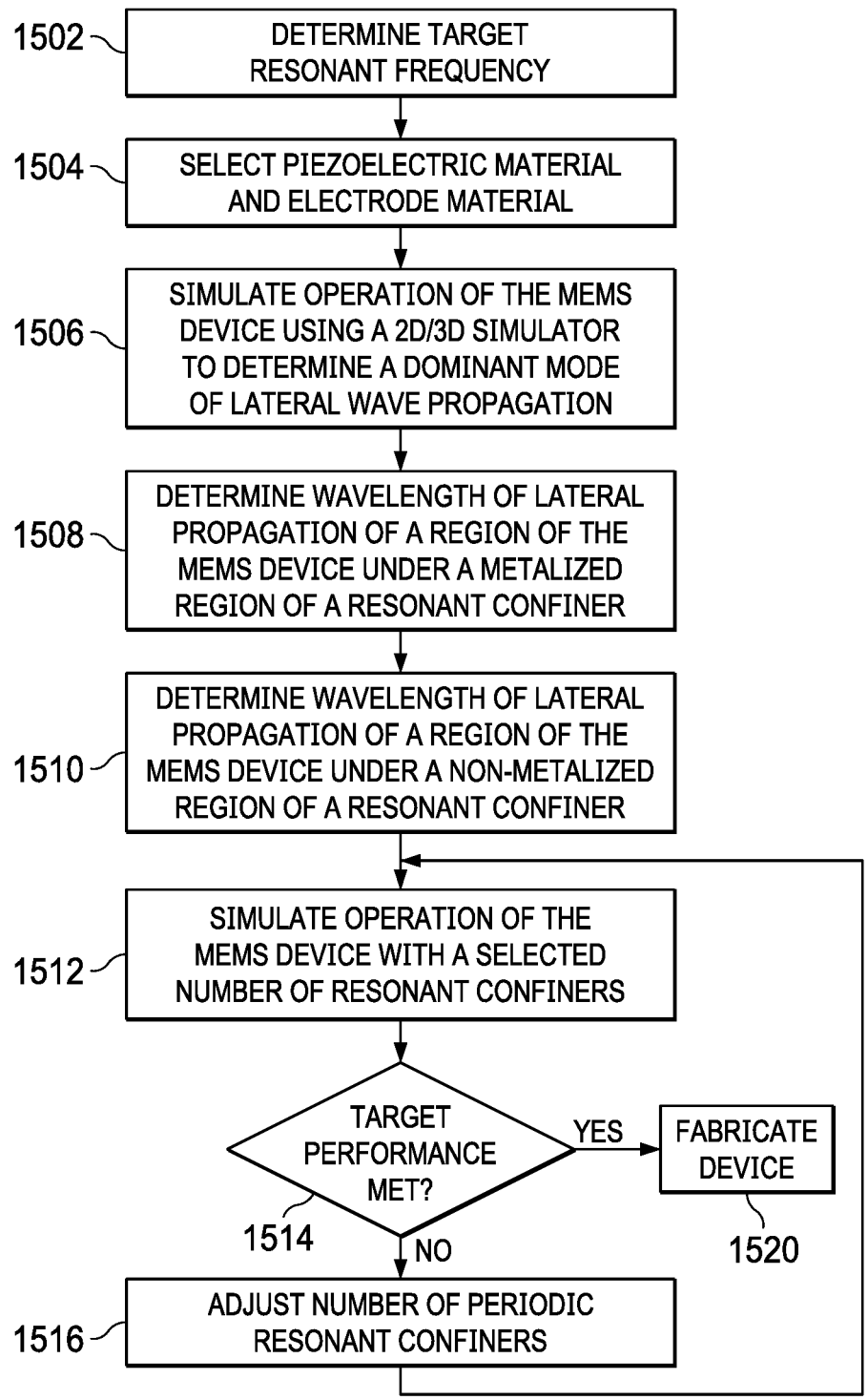
FIG. 15 is a flow chart illustrating design of a MEMS resonator device.

FIG. 15 is a flow chart illustrating design of a MEMS resonator device, such as any of the MEMS devices 500, 800, 1200, 1300 described hereinabove. As discussed in more detail hereinabove, in thickness mode piezoelectric MEMS resonators, such as a BAW device, a SMR device, or a FBARs device, the parallel resonance frequency (fp) exhibits a highly-dispersive mode of vibration whose vertical component shows large propagation in the lateral direction. As a result, this lateral energy leakage can affect the resonator quality factor at $f_p$ ($Q_p$), which is defined as the ratio of energy stored over the energy lost per cycle of vibration. In the case of small devices, the energy lost becomes dominated by acoustic losses. $Q_p$ is proportional to the resonator area over its perimeter. Patterned resonant confiners placed around the electrode of a thickness mode piezoelectric resonator mitigate the amount of lateral acoustic energy leakage. For efficient energy confinement, the width and separation of the metal strip lines forming the resonant confiners can be $\lambda/2$, where $\lambda$ represents the lateral wavelength of the propagating acoustic mode leaving the resonator at the parallel frequency. The resonant confiners are placed within the area of vibration, which is delimited by the Bragg mirrors in the case of BAW and SMR devices, and the released region in the case of a FBAR device.

At 1502, a designer first selects a target resonant frequency for a MEMS device. MEMS resonator devices using piezoelectric films with thicknesses ranging from several micrometers down to tenth of micrometers resonate in the frequency range of roughly 100 MHz to 10 GHz.

At 1504, a designer selects what materials will be used to fabricate the piezoelectric layer, electrodes, and resonant confiners. Aluminum nitride and zinc oxide are two common piezoelectric materials used in MEMS resonators. In some examples, the conductive members are formed by tungsten (W), titanium tungsten (TiW) or copper (Cu). In some examples, the dielectric members are formed by silicon dioxide ($SiO_2$), or a carbon doped oxide dielectric (such as SiCOH), or aluminum nitride (AlN).

At 1506, operation of an initial configuration of the MEMS resonator is simulated to determine a dominate mode of vibration of a lateral wave propagating away from the active area of the MEMS resonator. Operation of the pending MEMS device design is simulated using a two dimensional (2D) or three dimensional (3D) finite element simulator. A BAW resonator presents lateral standing waves which degrades its electrical performance. 2D/3D simulations are needed to predict the allocation and the effect of these lateral modes. Several known or later developed 2D/3D finite element simulator are available for this task. Referring back to FIGS. 3B, 5B, simulation reveals a zeroth-order anti-symmetrical mode of vibration dominates MEMS devices 300 and 500.

The wavelength of the lateral propagating wave is determined. As described above in more detail with regard to FIGS. 7B, 7C, the wavelength may be different in metalized regions in the vicinity of the resonant confiner microstrips and in the non-metalized regions between the resonant confiner microstrips. At 1508, the wavelength in the metalized regions is determined by simulating vibration modes of a block of material representative of the layer stackup of the MEMS device in the region of the metalized resonant confiner microstrip. A dispersion plot of frequency vs longitudinal component of the wave number ($k_x$) may be prepared based on the simulation that plots various vibration modes that are possible within the block of simulated material. The mode of vibration that matches the dominate mode of vibration for the device as determined in 1506 is then selected from the dispersion plot and used to determine the wavelength of a propagating wave at the resonant frequency $f_p$ in the metalized region.

At 1510, the wavelength in the non-metalized regions is determined by simulating vibration modes of a block of material representative of the layer stackup of the MEMS device in the non-metalized region between the resonant confiner microstrips. A dispersion plot of frequency vs longitudinal component of the wave number ($k_x$) may be prepared based on the simulation that plots various vibration modes that are possible within the block of simulated material. The mode of vibration that matches the dominate mode of vibration for the device as determined in 1506 is then selected from the dispersion plot and used to determine the wavelength of a propagating wave at the resonant frequency $f_p$ in the non-metalized region.

At 1512, operation of the MEMS device is simulated using a selected number of resonant confiners. For example, five resonant confiners may be selected for an initial design. The width of the resonant confiners is selected to be $\lambda/2$ based on the wavelength $f_p$ in the metalized region as determined at 1508. The space between resonant confiners is selected to be $\lambda/2$ based on the wavelength $f_p$ in the non-metalized region as determined at 1510. The distance between the edge of the top electrode and the first one of the set of concentric periodic resonant confiners is selected to be an integer multiple of $\lambda/4$ in the non-metalized region as determined at 1510.

At 1514, if the target performance parameters are not met by the pending design, at 1516 the designer may adjust number of resonant confiners and/or the distance between the edge of the top electrode and the first one of the set of concentric periodic resonant confiner and repeat the simulation at 1512 using the adjusted parameters. This loop may be repeated several times with various combinations of resonant confiner parameters until an acceptable design is determined.

At 1520, a design that meets target performance goals may then be fabricated using known or later developed semiconductor processing techniques with the parameters determined using this process.

While a resonant confiner width equal to $\lambda/2$ of $f_p$ in the metalized region and space between resonant confiners equal to $\lambda/2$ of $f_p$ in the non-metalized region, acceptable operation may be obtained within a range of +/−10% of the calculated values. As used herein, the term "$\lambda/2$" includes +/−10% $\lambda/2$. Similarly, the term "$\lambda/4$" includes +/−10% $\lambda/4$. Devices designed to operate at a higher or at a lower target frequency will have resonant confiner parameters selected to match the target frequency.

Other Embodiments

In described examples, a single MEMS acoustic wave resonator is mounted on a substrate, but in other examples there may be two or more MEMS resonators mounted on one or more substrates.

In described examples, the upper electrode is essentially octagonal. In other examples, the upper electrode may be round, oval, square, rectangular, or any polygon shape. Irregular polygon layouts help to suppress spurious modes.

The example IC package 1400 of FIG. 14 is a surface mount device with a plurality of contacts on a bottom side of the package. However, in other examples, the IC package may be any of a number of known or later developed configurations, and may have various form, material(s), shapes, dimension(s), number of contacts, shape of contacts, etc. Moreover, the MEMS acoustic wave resonator(s) and/or any other components may be packaged, mounted, etc. in the IC package in various configurations. Other example IC packages may be, for example, a wafer-level package or a die-level package.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board. Another example may include packages that are entirely encased in mold compound, such as a dual inline package (DIP).

In another example, the MEMS device may be fabricated using an additive manufacturing process. Additive manufacturing has enabled the deposition of patterned materials in a rapid and cost-efficient manner. Additive manufacturing processes are now being used in several areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility. Recent process advances allow additive manufacturing of 3D structures that have feature resolution of less than 100 nm, such as direct laser lithography, multi-photon lithograph, two-photon polymerization, etc.

The term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A micromechanical system (MEMS) resonator comprising:
a base substrate;
a piezoelectric member attached to the base substrate, the piezoelectric member having opposite first and second surfaces, a first electrode attached to the first surface, and a second electrode attached to the second surface, the first electrode having a perimeter edge; and
periodically spaced confiners attached to the first surface, the confiners being concentric with the first electrode and spaced from the perimeter edge, in which the confiners include first and second confiners having a width equal to one-half a wavelength of a lateral propagating acoustic wave at a parallel resonant frequency of the MEMS resonator in a metalized region.

2. The MEMS resonator of claim 1, wherein the wavelength is a first wavelength, and a space between the first and second confiners is equal to one-half a second wavelength of the lateral propagating acoustic wave at the parallel resonant frequency in a non-metalized region, and the first wavelength is different from the second wavelength.

3. The MEMS resonator of claim 1, wherein a space between the perimeter edge and a nearest one of the confiners is equal to an integer multiple of one-fourth a lateral wavelength of a propagating acoustic wave at a parallel resonant frequency of the MEMS resonator.

4. The MEMS resonator of claim 1, further comprising: a first acoustic mirror adjacent the second electrode and extending beyond an outermost perimeter of the confiners; and a second acoustic mirror adjacent the first electrode and the confiners and extending beyond an outermost perimeter of the confiners.

5. The MEMS resonator of claim 1, wherein the second electrode is separated from and spaced from the base substrate to form a released volume, and the released volume extends beyond an outermost perimeter of the confiners.

6. The MEMS resonator of claim 1, wherein the first electrode has a planar shape selected from a group consisting of: circular, oval, square, rectangular, trapezoidal, and an irregular polygon.

7. The MEMS resonator of claim 1, wherein a number of the confiners is at least five.

8. The MEMS resonator of claim 1, wherein a number of the confiners is at least ten.

9. The MEMS resonator of claim 1, wherein the confiners are metal.

10. A micromechanical system (MEMS) resonator comprising:
    a base substrate;
    a piezoelectric member attached to the base substrate, the piezoelectric member having opposite first and second surfaces, a first electrode attached to the first surface, and a second electrode attached to the second surface, the first electrode having a perimeter edge;
    periodically spaced confiners attached to the first surface, the confiners being concentric with the first electrode and spaced from the perimeter edge; and
    an acoustic mirror adjacent the second electrode and extending beyond an outermost perimeter of the confiners.

11. The MEMS resonator of claim 10, wherein the acoustic mirror is a first acoustic mirror, and the MEMS resonator further comprises a second acoustic mirror adjacent the first electrode and the confiners and extending beyond an outermost perimeter of the confiners.

12. The MEMS resonator of claim 10, wherein the first electrode has a planar shape selected from a group consisting of: circular, oval, square, rectangular, trapezoidal, and an irregular polygon.

13. The MEMS resonator of claim 10, wherein a number of the confiners is at least five.

14. The MEMS resonator of claim 10, wherein a number of the confiners is at least ten.

15. The MEMS resonator of claim 10, wherein the confiners are metal.

16. The MEMS resonator of claim 10, wherein the confiners include first and second confiners having a width equal to one-half a first wavelength of a lateral propagating acoustic wave at a parallel resonant frequency of the MEMS resonator in a metalized region, and a space between the first and second confiners is equal to one-half a second wavelength of the lateral propagating acoustic wave at the parallel resonant frequency in a non-metalized region, and the first wavelength is different from the second wavelength.

17. The MEMS resonator of claim 10, wherein a space between the perimeter edge and a nearest one of the confiners is equal to an integer multiple of one-fourth a lateral wavelength of a propagating acoustic wave at a parallel resonant frequency of the MEMS resonator.

18. A method of operating a micromechanical system (MEMS) resonator, the method comprising:
    operating the MEMS resonator at a parallel resonance frequency, the MEMS resonator including a first electrode and a second electrode separated by a piezoelectric layer;
    propagating an acoustic wave laterally away from a central region of the MEMS resonator through the piezoelectric layer;
    attenuating the acoustic wave with concentric confiners that surround a perimeter of the first electrode and are spaced from the first electrode; and
    confining the acoustic wave using an acoustic mirror adjacent the second electrode that extends beyond an extent of the concentric confiners.

19. The method of claim 18, wherein propagating the acoustic wave includes producing a first wavelength in a region adjacent one of the confiners and producing a second wavelength in a region between two of the confiners, and the first wavelength is different from the second wavelength.

20. The method of claim 18, wherein attenuating the acoustic wave comprises locking the acoustic wave within the concentric confiners.

21. The method of claim 18, further comprising propagating the acoustic wave through a region between a peripheral edge of the first electrode and the concentric confiners, in which the concentric confiners are spaced from the peripheral edge by an integer number of quarter wavelengths of the acoustic wave.

22. The method of claim 18, wherein the acoustic mirror is a first acoustic mirror, and the method further comprises confining the acoustic wave using a second acoustic mirror adjacent the first electrode that extends beyond the extent of the concentric confiners.

23. A method of designing a micromechanical system (MEMS) resonator, the method comprising:
    determining an active mode of vibration of the MEMS resonator by simulating operation of the MEMS resonator at a parallel resonance frequency, the MEMS resonator including a first electrode and a second electrode separated by a piezoelectric member;
    determining a first wavelength of an acoustic wave propagating through a metalized region of the MEMS resonator in the active mode of vibration by simulating vibration of the metalized region at the parallel resonance frequency;
    determining a second wavelength of an acoustic wave propagating through a non-metalized region of the MEMS resonator in the active mode of vibration by simulating vibration of the non-metalized region at the parallel resonance frequency;
    selecting a width for concentric confiners to equal one-half the first wavelength; and
    selecting a space between concentric confiners to equal one-half the second wavelength.

24. The method of claim 23, further comprising selecting a distance from a peripheral edge of the first electrode to an innermost one of the confiners to equal an integer number of one-fourth the second wavelength.

* * * * *